US012713890B2

(12) United States Patent
Hong et al.

(10) Patent No.: US 12,713,890 B2
(45) **Date of Patent: *Aug. 18, 2026**

(54) COMPUTING DEVICE AND ELECTRONIC DEVICE GUARANTEEING BANDWIDTH PER COMPUTATIONAL PERFORMANCE

(71) Applicant: Samsung Electronics Co., Ltd., Suwon-si (KR)

(72) Inventors: Young Jun Hong, Suwon-si (KR); Wonyong Lee, Seoul (KR); Alan Gara, Palo Alto, CA (US); Se Hyun Yang, Seongnam-si (KR); Wooseok Chang, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 348 days.

This patent is subject to a terminal disclaimer.

(21) Appl. No.: 18/358,386

(22) Filed: Jul. 25, 2023

(65) Prior Publication Data

US 2023/0369171 A1 Nov. 16, 2023

Related U.S. Application Data

(63) Continuation of application No. 18/101,565, filed on Jan. 25, 2023.

(Continued)

(30) Foreign Application Priority Data

Mar. 17, 2022 (KR) ........................ 10-2022-0033408

(51) Int. Cl.
*H10W 20/20* (2026.01)
*G06F 13/40* (2006.01)
(Continued)

(52) U.S. Cl.
CPC ........ *H10W 20/20* (2026.01); *G06F 13/4022* (2013.01); *H10B 80/00* (2023.02);
(Continued)

(58) Field of Classification Search
CPC ............. H01L 23/481; H01L 23/49816; H01L 23/49833; G06F 13/4022; H10W 20/20; H10W 70/65; H10W 90/00; H10B 80/00
See application file for complete search history.

(56) References Cited

U.S. PATENT DOCUMENTS 7,616,563 B1 * 11/2009 Eiriksson ................ H04L 69/12 370/469
8,139,482 B1 * 3/2012 Eiriksson ............. H04L 45/306 370/230

(Continued)

FOREIGN PATENT DOCUMENTS

CA 3100481 A1 * 11/2019 ............ H10W 90/00
CN 101013387 A * 8/2007

(Continued)

OTHER PUBLICATIONS

M. Sato et al., “Co-Design for A64FX Manycore Processor and ‘Fugaku’,” *SC20: The International Conference for High Performance Computing, Networking, Storage and Analysis*, pp. 1-15, Nov. 9, 2020, IEEE, conference held virtually Nov. 9-19, 2020, Atlanta, Georgia, paper presented on Nov. 18, 2020, https://doi.org/10.1109/SC41405.2020.00051.

(Continued)

*Primary Examiner* — Laura M Menz
(74) *Attorney, Agent, or Firm* — NSIP Law

(57) ABSTRACT

A computing device includes: a processor; a memory stack in which memories connected to the processor are stacked; and a substrate disposed under the processor, wherein a memory bandwidth between the processor and the memory
(Continued)

stack is five or less times a network bandwidth between the processor and the substrate.

20 Claims, 23 Drawing Sheets

Related U.S. Application Data

(60) Provisional application No. 63/308,313, filed on Feb. 9, 2022.

(51) Int. Cl.
*H10B 80/00* (2023.01)
*H10W 70/65* (2026.01)
*H10W 90/00* (2026.01)
*H10W 70/60* (2026.01)

(52) U.S. Cl.
CPC ........... *H10W 70/65* (2026.01); *H10W 90/00* (2026.01); *H10W 90/401* (2026.01); *H10W 90/701* (2026.01); *H10W 90/722* (2026.01); *H10W 70/60* (2026.01); *H10W 90/724* (2026.01)

(56) References Cited

U.S. PATENT DOCUMENTS 8,547,769 B2 * 10/2013 Saraswat .................. G11C 5/14
365/189.09
8,583,898 B2 * 11/2013 Greyzck ............. G06F 9/30036
382/253
8,873,320 B2 * 10/2014 Goel ...................... G11C 29/76
365/150
9,058,453 B2 * 6/2015 Keckler .............. G06F 13/1668
9,432,298 B1 * 8/2016 Smith ..................... H04L 47/34
9,886,409 B2 * 2/2018 Keckler .............. G06F 13/4068
11,367,711 B2 * 6/2022 Harris ................... H10W 90/00
11,977,766 B2 * 5/2024 Dally .................... G06F 3/0655
11,989,587 B2 * 5/2024 Illikkal ................. G06F 9/5016
12,099,453 B2 * 9/2024 Dally .................. G06F 13/1689
12,223,201 B2 * 2/2025 Dally .................... G06F 3/0604
2009/0031066 A1 * 1/2009 Bansal .................. G06F 9/5083
710/113
2013/0044554 A1 * 2/2013 Goel ...................... G11C 29/76
365/200
2014/0351780 A1 * 11/2014 Keckler ................ G06F 13/409
716/117
2016/0306673 A1 * 10/2016 You ....................... G06F 9/5044
2017/0170153 A1 * 6/2017 Khare ................. G06F 13/4022
2017/0212857 A1 * 7/2017 Keckler .............. G06F 13/1668
2018/0046908 A1 * 2/2018 Cox ........................ G06N 3/065
2019/0319626 A1 * 10/2019 Dabral ............... H03K 19/1776
2020/0053002 A1 * 2/2020 Heidelberger .......... H04L 45/14
2020/0211969 A1 * 7/2020 Hossain .............. H10W 70/611
2021/0118853 A1 * 4/2021 Harris ................... H10W 90/00
2021/0157656 A1 * 5/2021 Frohwitter ............ G06F 9/5094
2021/0279587 A1 * 9/2021 Egger ........................ G06F 8/35
2021/0406075 A1 * 12/2021 Illikkal ................. G06F 9/4881
2023/0253294 A1 * 8/2023 Lee ..................... G06F 13/4022
257/690
2023/0254253 A1 * 8/2023 Hong .................. G06F 13/4068
370/235
2023/0254269 A1 * 8/2023 Lee ..................... H04L 49/1515
370/388
2023/0275068 A1 * 8/2023 Dally .................... H10W 90/00
257/213
2023/0297269 A1 * 9/2023 Dally .................... G06F 3/0679
711/154
2023/0315651 A1 * 10/2023 Dally .................. G06F 13/1673
711/5
2023/0369171 A1 * 11/2023 Hong .................. G06F 13/4022
2023/0412524 A1 * 12/2023 Lee ..................... H04L 49/1515
2024/0205169 A1 * 6/2024 Hong ...................... H04L 49/15
2024/0211166 A1 * 6/2024 Dally .................... G06F 3/0655
2024/0377953 A1 * 11/2024 Tavallaei ................ G06F 3/061
2024/0411709 A1 * 12/2024 Dally ................... G11C 7/1003
2025/0036589 A1 * 1/2025 Kloth .................. G06F 13/1668
2025/0071067 A1 * 2/2025 Song ....................... H04L 47/52
2025/0123984 A1 * 4/2025 Balachandran ..... G06F 9/38873
2025/0239509 A1 * 7/2025 Chia .................. H01L 25/0655
2026/0010486 A1 * 1/2026 Wang ...................... G06F 13/28
2026/0010491 A1 * 1/2026 Clark ...................... G06F 13/28
2026/0010493 A1 * 1/2026 Arditti Ilitzky ......... G06F 13/28
2026/0010494 A1 * 1/2026 Majors .................... G06F 13/28
2026/0010501 A1 * 1/2026 Maguire ................. G06F 13/28
2026/0011642 A1 * 1/2026 Majors .................... G06F 13/28
2026/0068640 A1 * 3/2026 Ghosh ................. H10W 20/435

FOREIGN PATENT DOCUMENTS

CN 101727494 B * 3/2012
CN 104253860 A * 12/2014
CN 104603739 A * 5/2015 ............. G06F 3/064
CN 112400161 A * 2/2021 ............ H10W 90/00
CN 113361704 A * 9/2021 ........... G06N 3/0464
CN 108241484 B 10/2021
CN 113517271 A 10/2021
CN 113608976 A * 11/2021 .......... G06F 11/3447
CN 113849223 A * 12/2021 ......... G06F 9/30036
CN 116664382 A * 8/2023 ............ H10W 80/00
CN 116664383 A * 8/2023 ........... G06F 3/0655
CN 116893777 A * 10/2023 ........... G06F 13/161
CN 117061523 A * 11/2023 ......... H04L 67/1008
CN 117724847 A * 3/2024
CN 118964246 A * 11/2024 ........... G06F 3/0673
CN 120104554 A * 6/2025 ....... G06F 15/17306
DE 102023103632 A1 * 8/2023 ............ H10W 80/00
DE 102023104326 A1 * 8/2023 ........... G06F 3/0655
DE 102024136265 A1 * 7/2025 ........... H01L 23/482
JP 2011501465 A * 1/2011 ............... G02B 6/43
JP 5154652 B2 * 2/2013 ............... G02B 6/43
JP 2021524977 A * 9/2021 ............ H10W 90/00
JP 7346555 B2 * 9/2023 ............ H10W 90/00
JP 2023168350 A * 11/2023 ............ H10W 90/00
JP 7557586 B2 * 9/2024 ............ H10W 90/00
KR 20190100632 A * 8/2019 ........... G11C 7/1009
KR 20210020925 A * 2/2021 ............ H10W 90/00
KR 10-2021-0042446 A 4/2021
KR 20210113004 A * 9/2021 ............. G06N 3/082
KR 20230120530 A * 8/2023 ......... G06F 13/4022
KR 20230120559 A * 8/2023 ......... G06F 13/4282
KR 20250030192 A * 3/2025 ........... G06F 3/0604
KR 20250115343 A * 7/2025 ........... H01L 23/482
WO WO-2012135772 A2 * 10/2012 ............ H10W 90/00
WO WO-2013132742 A1 * 9/2013 ......... G06Q 30/0621
WO WO-2014190328 A1 * 11/2014 ......... G06F 13/4068
WO WO-2019221902 A1 * 11/2019 ............... G02B 6/43
WO WO-2021159360 A1 * 8/2021 .............. G11C 29/44
WO WO-2026010731 A1 * 1/2026 ............. G06F 13/14

OTHER PUBLICATIONS

A. Khan et al., "An Analysis of System Balance and Architectural Trends Based on Top500 Supercomputers," *HPC Asia 2021: The International Conference on High Performance Computing in Asia-Pacific Region*, pp. 11-22, Jan. 20, 2021, ACM, conference held virtually Jan. 20-22, 2021, Republic of Korea, paper presented on Jan. 20, 2021, https://doi.org/10.1145/3432261.3432263.

J. Choquette et al, "3.2 The A100 Datacenter GPU and Ampere Architecture," *2021 IEEE International Solid-State Circuits Conference* (*ISSCC 2021*), *Digest of Technical Papers*, vol. 64, pp. 48-50, Feb. 2021, IEEE, conference held virtually Feb. 13-22, 2021, San Francisco, paper presented on Feb. 15, 2021, https://doi.org/10.1109/ISSCC42613.2021.9365803.

(56) References Cited

OTHER PUBLICATIONS

Korean Office Action Issued on Jan. 13, 2026, in Counterpart Korean Patent Application No. 10-2022-0033408 (6 Pages in English, 10 Pages in Korean).

* cited by examiner

Ball Map (Top view)
1mm pitch 0.6mm diameter ball 25x25 array

Ball Map (Top view)
1mm pitch 0.6mm diameter ball 25x25 array

COMPUTING DEVICE AND ELECTRONIC DEVICE GUARANTEEING BANDWIDTH PER COMPUTATIONAL PERFORMANCE

CROSS-REFERENCE TO RELATED APPLICATIONS

This application is a continuation of U.S. patent application Ser. No. 18/101,565 filed on Jan. 25, 2023 which claims the benefit under 35 USC § 119(e) of U.S. Provisional Application No. 63/308,313 filed on Feb. 9, 2022, and the benefit under 35 USC § 119(a) of Korean Patent Application No. 10-2022-0033408 filed on Mar. 17, 2022 with the Korean Intellectual Property Office, the entire disclosures of which are incorporated herein by reference for all purposes.

BACKGROUND

1. Field

The following description relates to a computing device and an electronic device guaranteeing a bandwidth per computational performance.

2. Description of Related Art

An increase in the size of an applied problem processed in a large-scale computing system may increase information exchanges between processors and/or memories. However, when an application performance is limited by an input/output (I/O) bandwidth, a sufficient bandwidth may not be secured.

SUMMARY

This Summary is provided to introduce a selection of concepts in a simplified form that are further described below in the Detailed Description. This Summary is not intended to identify key features or essential features of the claimed subject matter, and is not intended to be used as an aid in determining the scope of the claimed subject matter.

In one general aspect, a computing device includes: a processor; a memory stack in which memories connected to the processor are stacked; and a substrate disposed under the processor, wherein a memory bandwidth between the processor and the memory stack is five or less times a network bandwidth between the processor and the substrate.

A computational performance of the processor may be determined based on an area of the processor, and the network bandwidth per the computational performance of the processor may be greater than or equal to 0.1 bytes per flop.

An area of the substrate may be five or greater times an area of the processor.

The memory bandwidth may be determined based on a through-silicon via (TSV) area present between the processor and the memory stack, and the network bandwidth may be determined based on an input/output (I/O) area of the processor and an area of the substrate.

The processor may be configured to: determine the memory bandwidth by controlling a number of TSV connections to the memory stack and a memory signal frequency of the memory stack; and determine the network bandwidth by controlling a number of I/O connections to the substrate and an I/O signal frequency of the substrate.

The memory stack may be disposed on the processor to be directly connected to the processor without a buffer.

The processor may be disposed in a direction in which a circuit board of the processor faces the substrate, the processor and the memory stack may be connected through a TSV, and the processor and the substrate may be connected through a bump.

The processor may be disposed in a direction in which a circuit board of the processor faces the memory stack, the processor and the memory stack may be connected as a TSV connected to the memory stack and an upper end pad of the processor may be connected through a micro-bump, and the processor and the substrate may be connected through a bump.

The computing device may include: a buffer configured to connect the memory stack and the processor; and an interposer disposed between the processor and the substrate, wherein the memory stack may be disposed on the buffer, and may be connected to the processor through the buffer and the interposer.

A number of channels used in the computing device may be determined based on a total number of available lanes and a number of allocated lanes per channel of the computing device, the total number of available lanes may be determined by either one or both of an area of the processor and an area of the substrate, and the number of allocated lanes per channel may be determined according to a network protocol of the computing device.

An electronic device may include: a plurality of computing devices and switches grouped into a plurality of groups, the computing devices comprising the computing device, wherein each of switches comprised in a first group among the groups may be exclusively connected to any one of switches comprised in a second group among the groups, and a connection between a computing device and a switch in the same group and a connection between switches in different groups may be an electrical connection.

In another general aspect, an electronic device includes: a plurality of computing devices and switches grouped into a plurality of groups, wherein switches in a same group among the groups are fully connected to computing devices in the same group, wherein each of switches comprised in a first group among the groups is, among switches comprised in a second group among the groups, exclusively connected to any one of the switches comprised in the second group, wherein a connection between a computing device and a switch in the same group and a connection between switches in different groups are an electrical connection, wherein one or more of the computing devices comprises: a processor; a memory stack in which memories connected to the processor are stacked; and a substrate disposed under the processor, and wherein a memory bandwidth between the processor and the memory stack is five or less times a network bandwidth between the processor and the substrate.

A computational performance of the processor may be determined based on an area of the processor, and the network bandwidth per the computational performance of the processor may be greater than or equal to 0.1 bytes per flop.

An area of the substrate may be five or greater times an area of the processor.

The memory bandwidth may be determined based on a through-silicon via (TSV) area present between the processor and the memory stack, and the network bandwidth may be determined based on an input/output (I/O) area of the processor and an area of the substrate.

The processor may be configured to: determine the memory bandwidth by controlling a number of TSV connections to the memory stack and a memory signal frequency of the memory stack; and determine the network bandwidth by controlling a number of I/O connections to the substrate and an I/O signal frequency of the substrate.

The memory stack may be disposed on the processor to be directly connected to the processor without a buffer.

The processor may be disposed in a direction in which a circuit board of the processor faces the substrate, the processor and the memory stack may be connected through a TSV, and the processor and the substrate may be connected through a bump.

The processor may be disposed in a direction in which a circuit board of the processor faces the memory stack, the processor and the memory stack may be connected as a TSV connected to the memory stack and an upper end pad of the processor may be connected through a micro-bump, and the processor and the substrate may be connected through a bump.

The electronic device may include a buffer configured to connect the memory stack and the processor; and an interposer disposed between the processor and the substrate, wherein the memory stack may be disposed on the buffer and is connected to the processor through the buffer and the interposer.

In another general aspect, an electronic device includes: a computing board comprising: a plurality of computing devices, wherein each of the computing devices comprises a processor, a memory stack in which memories connected to the processor are stacked, and a substrate disposed under the processor; and a switch group comprising a plurality of switches, wherein each of the switches is connected to each of the computing devices.

The electronic device may include: a plurality of other computing boards, each comprising another switch group, wherein each of the switches may be exclusively connected to a single switch in each of other switch groups.

A total number of the computing devices may be greater than a total number of the switches.

Other features and aspects will be apparent from the following detailed description, the drawings, and the claims.

Figure 1:
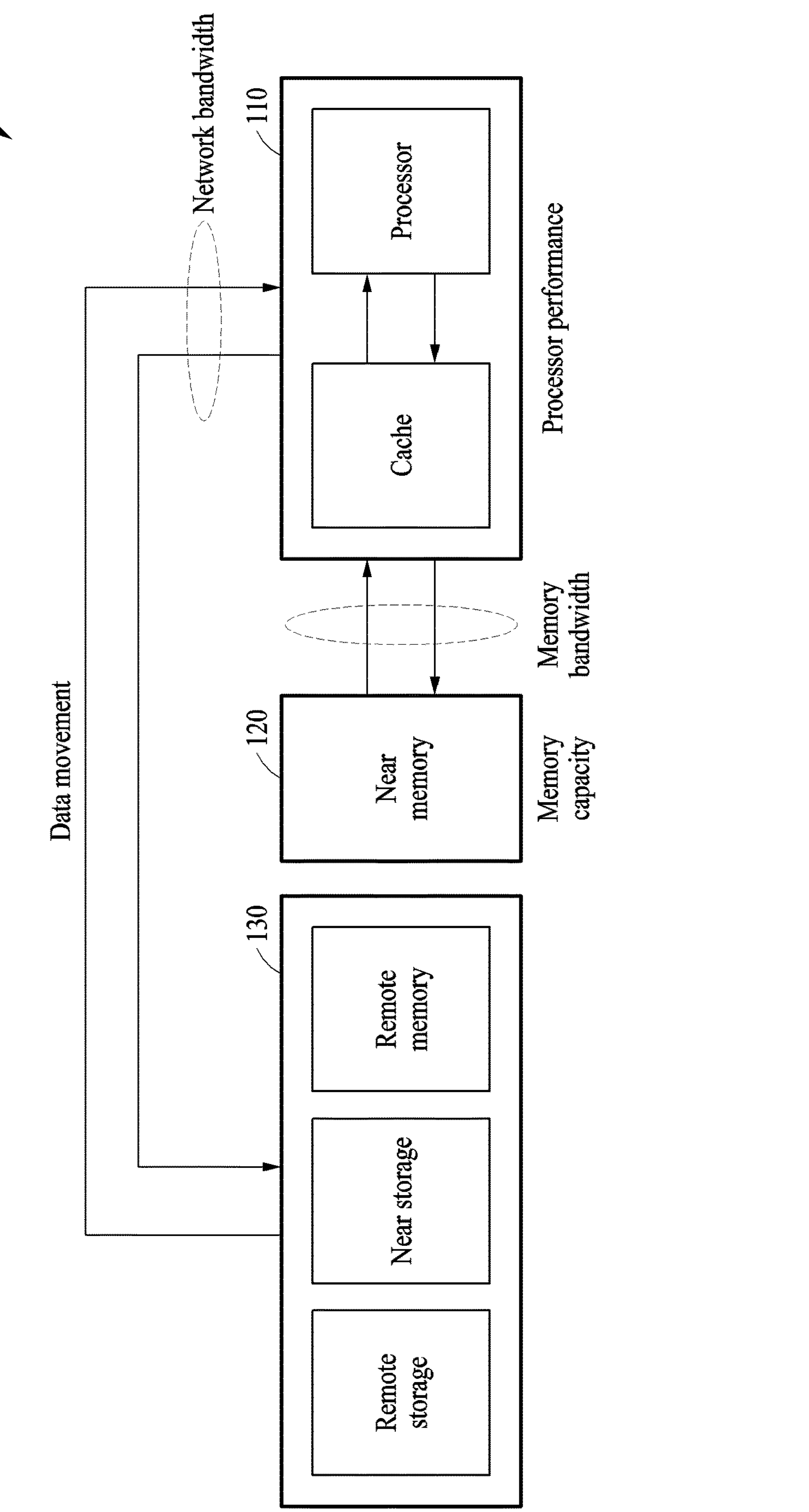
FIG. 1 illustrates an example of a system design factor.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known, after an understanding of the disclosure of this application, may be omitted for increased clarity and conciseness.

Although terms such as “first,” “second,” and “third” may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in the examples described herein may also be referred to as a second member, component, region, layer, or section without departing from the teachings of the examples.

Throughout the specification, when a component is described as being “connected to,” or “coupled to” another component, it may be directly “connected to,” or “coupled to” the other component, or there may be one or more other components intervening therebetween. In contrast, when an element is described as being “directly connected to,” or “directly coupled to” another element, there can be no other elements intervening therebetween. Likewise, similar expressions, for example, “between” and “immediately between,” and “adjacent to” and “immediately adjacent to,” are also to be construed in the same way. As used herein, the term “and/or” includes any one and any combination of any two or more of the associated listed items.

The terminology used herein is for describing various examples only and is not to be used to limit the disclosure. The articles “a,” “an,” and “the” are intended to include the plural forms as well, unless the context clearly indicates otherwise. The terms “comprises,” “includes,” and “has” specify the presence of stated features, numbers, operations, members, elements, and/or combinations thereof, but do not preclude the presence or addition of one or more other features, numbers, operations, members, elements, and/or combinations thereof. The use of the term “may” herein with respect to an example or embodiment (for example, as to what an example or embodiment may include or implement) means that at least one example or embodiment exists where such a feature is included or implemented, while all examples are not limited thereto.

Unless otherwise defined, all terms, including technical and scientific terms, used herein have the same meaning as commonly understood by one of ordinary skill in the art to which this disclosure pertains and based on an understanding of the disclosure of the present application. Terms, such as those defined in commonly used dictionaries, are to be interpreted as having a meaning that is consistent with their meaning in the context of the relevant art and the disclosure of the present application, and are not to be interpreted in an idealized or overly formal sense unless expressly so defined herein.

Also, in the description of example embodiments, detailed description of structures or functions that are thereby known after an understanding of the disclosure of the present application will be omitted when it is deemed that such description will cause ambiguous interpretation of the example embodiments. Hereinafter, examples will be described in detail with reference to the accompanying drawings, and like reference numerals in the drawings refer to like elements throughout.

FIG. 1 illustrates an example of a system design factor.

Referring to FIG. 1, a computing device 100 may include a processor 110 (e.g., including a cache and one or more processors), a memory 120 (e.g., including a near memory), and a storage 130 (e.g., including a near storage and one or more remote storages and memories).

Various applications used in a high-performance computing (HPC) environment may have a considerably high required system performance compared to a general computing environment, and thus an overall performance may be limited or determined by a specific system element in terms of time-to-results. As a method of analyzing a required application performance based on application characteristics, a roofline model analysis may be used. Through a roofline model, a peak computational performance provided by the system and an input/output (I/O) bandwidth (e.g., a dynamic random-access memory (DRAM) bandwidth) may be used to distinguish a compute-bound area and a memory bandwidth-bound area. In addition, through the roofline model, whether a given computational performance may be maximized or limited by an I/O bandwidth may be analyzed based on arithmetic intensity required by an application to be performed. Through this analysis, a desirable magnitude of the peak computational performance and a desirable size of the I/O bandwidth may be selected according to a desired application characteristic when constructing the system.

System design factors required by an application may include a computational performance, a memory capacity, and/or a memory bandwidth. A characteristic of the memory bandwidth may be that the memory bandwidth is expandable to a network bandwidth and a storage bandwidth. A characteristic of the memory capacity may be that the memory capacity is expandable to a cache capacity and a storage capacity. In general, the computational performance may be an element that is directly connected to the difficulty of a problem to be solved (i.e., arithmetic intensity), the memory capacity may be an element that is directly connected to the size of a problem (i.e., a storage space for defining the problem to be solved), and the memory bandwidth may be an element corresponding to a speed of an information movement between a computing device (e.g., a processor) and a storage space in which a problem related to an information exchange efficiency is defined.

When analyzing large-scale application characteristics based on these characteristics, the system may be defined in consideration of the memory capacity and the memory bandwidth, as main elements, in addition to the computational performance. When the memory capacity lacks, a storage may be used, and thus a storage bandwidth or a network bandwidth may be an element that determines the speed of the information movement. Considering that a pattern of an information movement from a space in which information is stored to a computing device may be different for each application, the system performance may be modeled based on a communication pattern of each application. In this example, bandwidth elements may become main design factors. Elements that affect a bandwidth may be various, for example, a cache, a memory, a storage, a network, and/or the like, for each step. The system may be constructed in consideration of, as an important design factor, a byte-per-flop indicating a bandwidth per computational performance which is a relative concept of the bandwidth per computational performance. Byte-per-flop may indicate a quantity of bytes that is transmitted between a computing device and an off-chip memory based on a memory intensity per computing task or the number of floating-point operations required for a specific task.

Figure 2:
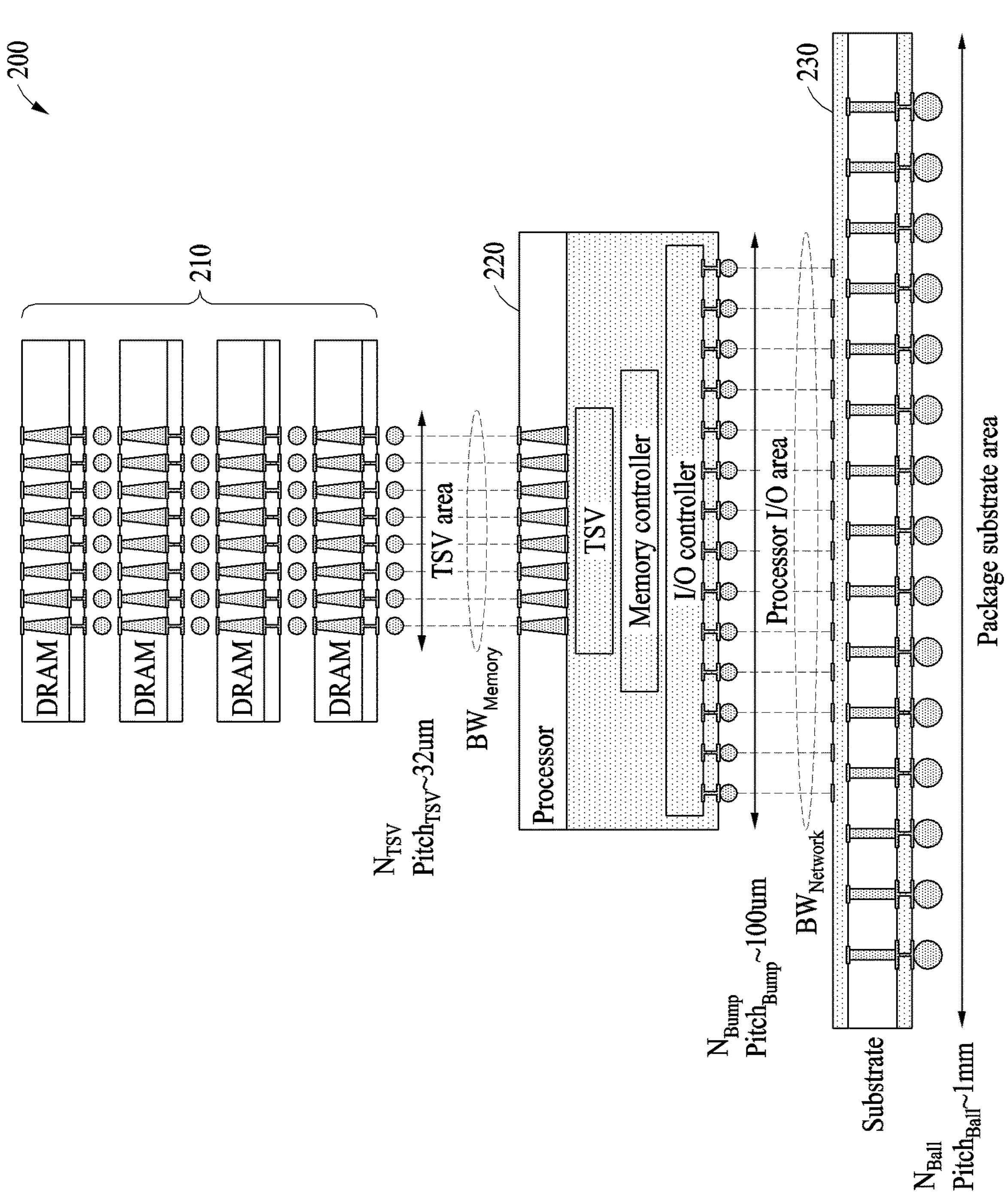
FIG. 2 illustrates an example of a structure of a computing device.

FIG. 2 illustrates an example of a structure of a computing device.

Referring to FIG. 2, a computing device 200 may include a memory stack 210, a processor 220, and a substrate 230. Although the memory stack 210 is illustrated in FIG. 2 as including four dynamic random-access memories (DRAMs) for the convenience of description, examples are not limited thereto. In other non-limiting examples, a high bandwidth memory (HBM) stack including various numbers of DRAMs may be applied without limitation.

When the memory stack 210 is mounted directly on the processor 220 based on a three-dimensional (3D) structure, a buffer and a silicon interposer may no longer be needed, which may reduce related costs and a high-speed signal transmission/reception path, and may thereby reduce power consumption.

The memory stack 210 may be mounted directly on the processor 220. Thus, to increase a yield in terms of system integration, minimizing the size of the processor 220 according to the single memory stack 210 may be effective, rather than mounting a plurality of memory stacks. By maximizing, as a main system design factor, a balance ratio between a memory bandwidth and a processor performance, a structure that is effective in a memory bandwidth-intensive workload may be provided through a combination of a small chip and an HBM.

In contrast, when the memory stack 210 is mounted on the processor 220 in the 3D structure, a bottom area of the processor 220 may be entirely applicable to an I/O bandwidth allocation compared to a 2.5-dimensional (D) structure, and an I/O bandwidth to be allocated to the processor 220 may also be maximized. Using this structural characteristic, a maximum network bandwidth, in addition to a memory bandwidth, may be secured. Thus, even at a node level for connecting a plurality of computing devices through an electrical network, a preset or higher bandwidth per computational performance may be guaranteed. A non-limiting example of the bandwidth per computational performance at such a node level will be described in detail with reference to FIGS. 7 through 9.

Based on the processor 220, a memory bandwidth $BW_{Memory}$ may be limited by a through-silicon via (TSV) area, and a network bandwidth may be limited by a processor I/O area and a package substrate area. Thus, an upper end of the processor 220 may be used to obtain an HBM, and a lower end of the processor 220 may be used to obtain a high bandwidth network. The memory bandwidth and the network bandwidth may be adjusted independently as described above and the processor performance may be preferentially determined before the balance ratio, and the small chip may thereby be implemented.

A structure of the upper end of the processor 220 may be used to adjust the number $N_{TSV}$ of TSV connections and a memory signal frequency $F_{TSV}$ to determine the memory bandwidth. In addition, a structure of the lower end of the processor 220 may be used to adjust the number $N_{IO}$ of I/O connections and an I/O signal frequency $F_{IO}$ to determine the network bandwidth. For example, the memory bandwidth may be determined to be $N_{TSV} \times F_{TSV}$, and the network bandwidth may be determined to be $N_{IO} \times F_{IO}$.

In this example, the number $N_{IO}$ of the I/O connections at the lower end of the processor 220 may be proportional to the processor I/O area, but be limited by an entire size of the package substrate area in some examples according to a total size of the processor 220. For example, when a bump pitch $Pitch_{Bump}$ is 100 um while a package ball pitch $Pitch_{Ball}$ is approximately 1 mm which is greater than the bump pitch by a factor of about 10 times, the network bandwidth may be limited by the package substrate area when an allocatable $N_{IO}$ lacks because $N_{bump}$ compared to $N_{ball}$ connectable by a ball pad on a high-speed electrical signal transmission line is extremely large.

Based on this, provided herein may be a system that may guarantee a predetermined or higher level of a bandwidth per computational performance even at the node level that connects various computing devices through the combination of the small chip and the high bandwidth I/O. The computing device 200 provided herein may be effective in a memory bandwidth-intensive workload, rather than in a compute-intensive workload, and may optimize a single processor performance based on a single HBM performance and maximize a network bandwidth.

The computing device 200 may minimize the size of the processor 220 based on the single memory stack 210 through the combination of the small chip and the HBM, and increase the yield of the computing device 200 in terms of system integration. In addition, the computing device 200 may maximize the balance ratio between the memory bandwidth and the processor performance, and may thus be effective in the memory bandwidth-intensive workload. The memory stack 210 may be mounted on the processor 220 in the 3D structure and the bottom area of the processor 220 may thus be entirely allocated to the I/O bandwidth. Thus, the computing device 200 may maximize the I/O bandwidth. In the computing device 200, the memory bandwidth between the processor 220 and the memory stack 210 may be within five times the network bandwidth between the processor 220 and the substrate 230, and may be larger than the network bandwidth. That is, a difference between the memory bandwidth and the network bandwidth may not be great. In addition, an area of the substrate 230 may be five times or more than the area of the processor 220.

Figure 3:
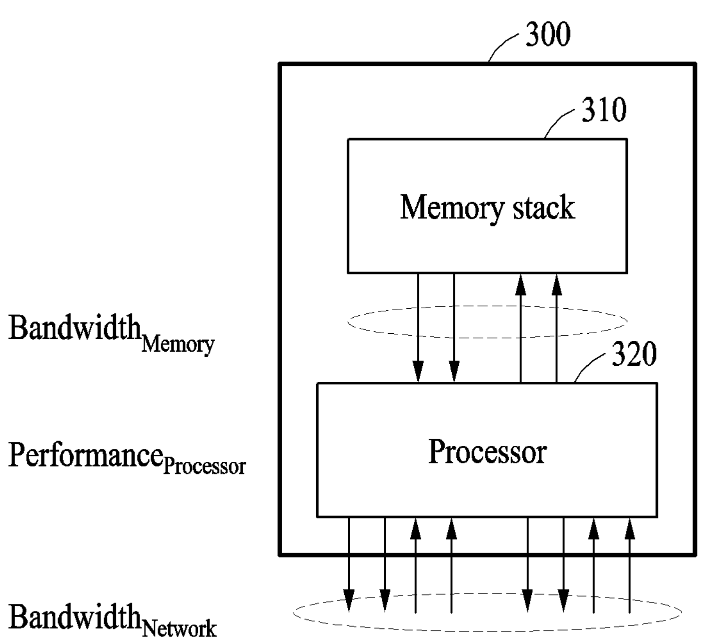
FIG. 3 illustrates an example of a bandwidth of a computing device.

FIG. 3 illustrates an example of a bandwidth of a computing device.

A computing device 300 may include a single memory stack 310 and a single processor 320. However, examples are not limited thereto, and a plurality of memory stacks and a single processor, or a plurality of memory stacks and a plurality of processors may be applied without limitation. A memory bandwidth $Bandwidth_{Memory}$ may be determined by a connection structure between the memory stack 310 and the processor 320, a computational performance $Performance_{Processor}$ may be determined based on the size and structure of the processor 320, and a network bandwidth $Bandwidth_{Network}$ may be determined based on an I/O structure connected to the outside of the computing device 300.

In the computing device 300, channels may include both a physical connection and a virtual connection, and the number $N_{CH}$ of channels may be determined by a total number $K_{SC}$ of lanes available for the computing device 300 and the number $L_{CH}$ of lanes allocated to each channel. The total number of lanes available for the computing device 300 may be limited or determined by the entire size of a die area of the processor 320 and/or the entire size of a package substrate area. The number of allocated lanes per channel may be determined according to a characteristic of a network protocol used for high-speed electrical signal transmission.

Figure 4:
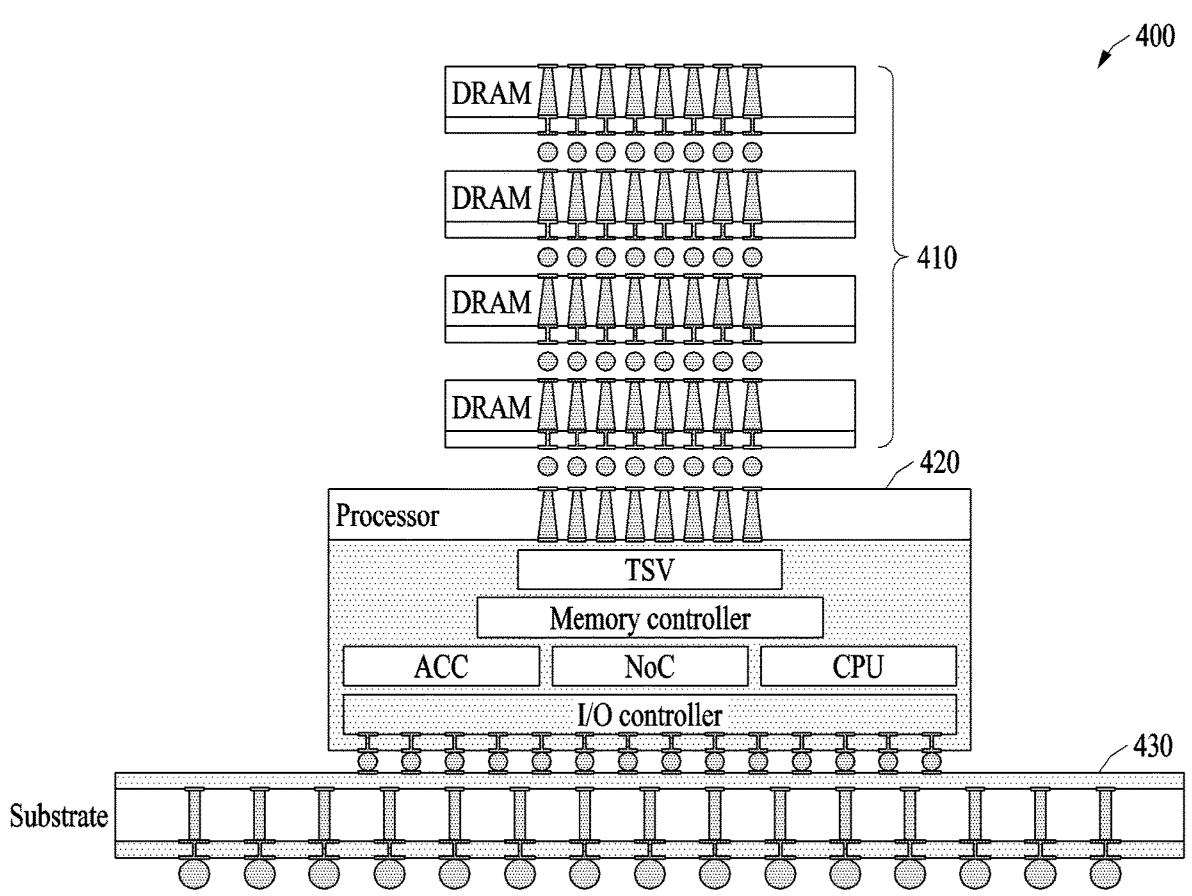
FIGS. 4 through 6 illustrate examples of a structure of a computing device.
Figure 5:
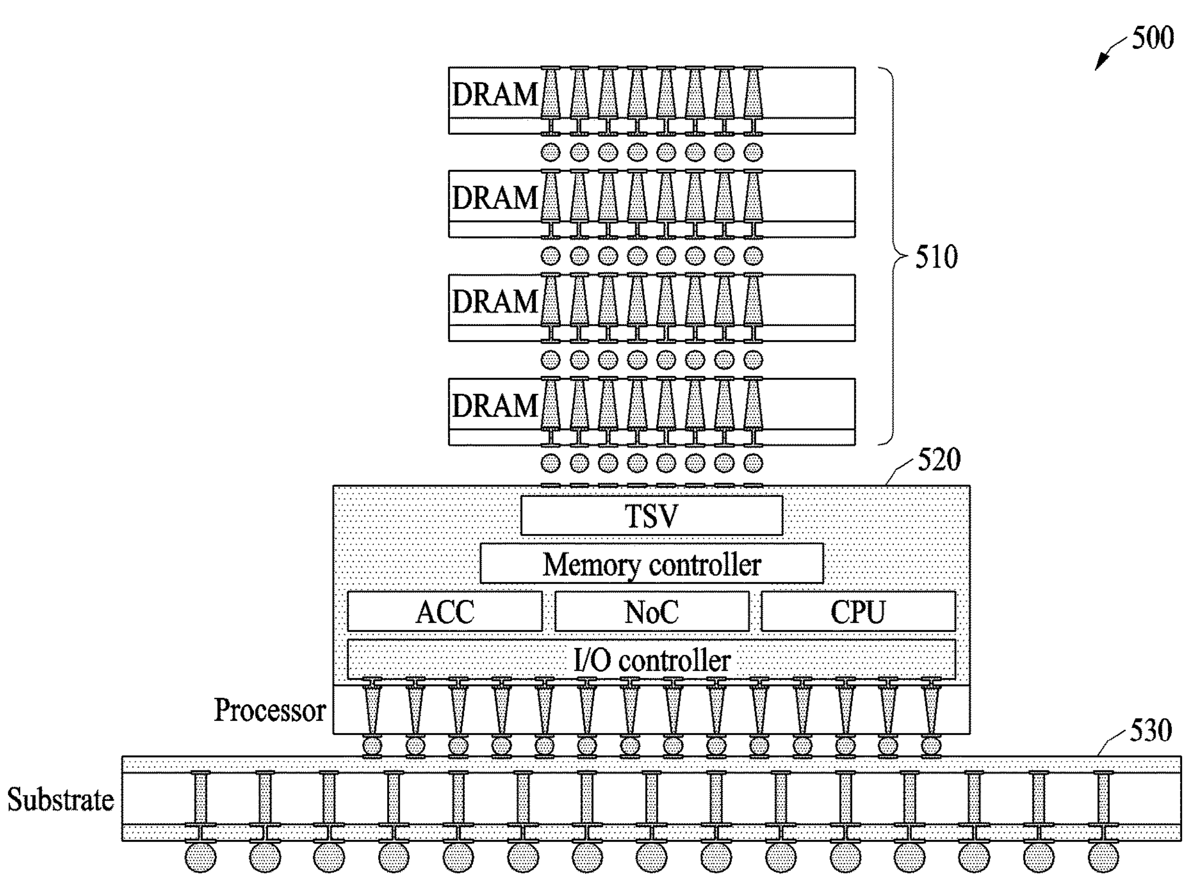
Figure 6:
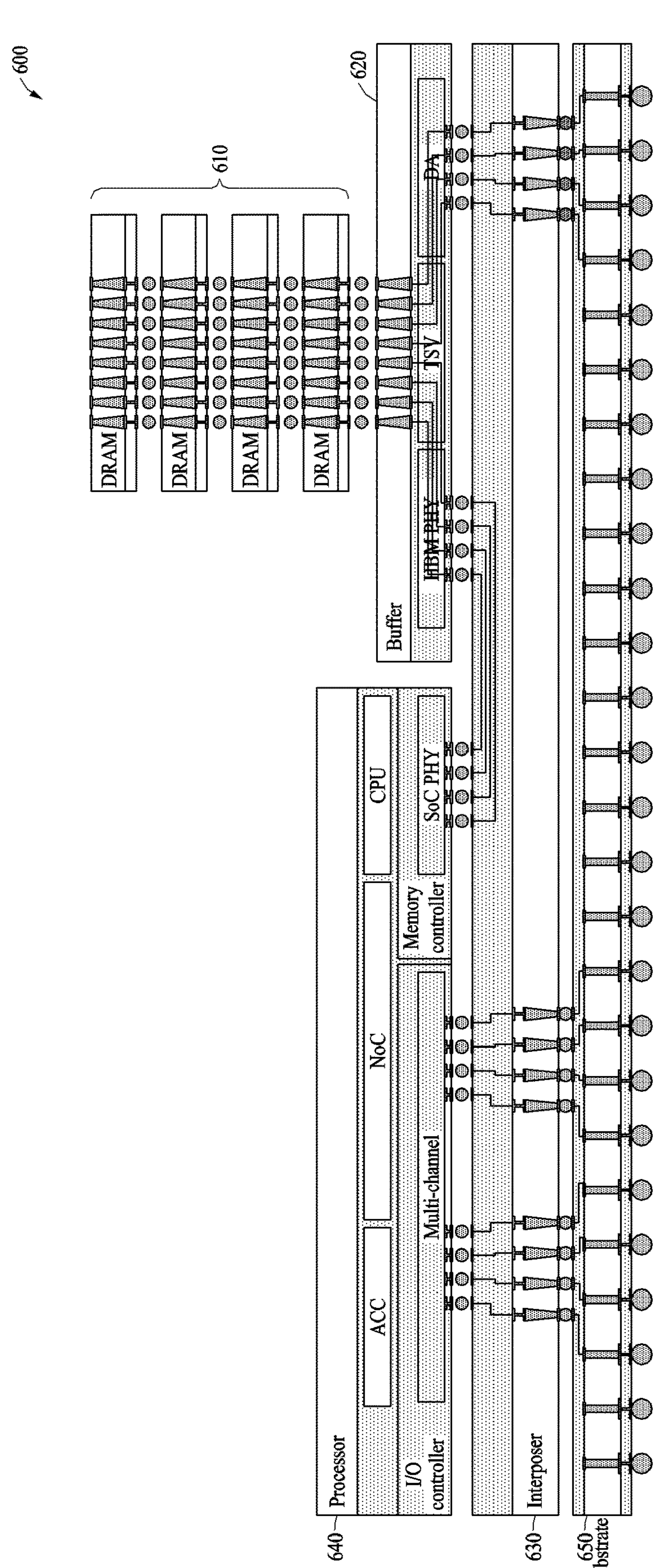

FIGS. 4 through 6 illustrate examples of a structure of a computing device.

When a computing device is constructed using a 3D structure, a memory stack may be connected on a processor disposed on a package substrate. In this example, a structure in which a circuit board of the processor disposed in the middle faces downward (e.g., where the processor is disposed in a direction in which the circuit board faces the substrate) may be referred to a face-down structure, and a structure in which the circuit board of the processor faces upward (e.g., where the processor is disposed in a direction in which the circuit board faces the memory stack) may be referred to as a face-up structure.

FIG. 4 illustrates a computing device 400 of the face-down structure. In the computing device 400, a memory stack 410 may be disposed directly on a processor 420, and thus there may be no buffer (e.g., no buffer connected between the memory stack 410 and the processor 420).

In the computing device 400 of the face-down structure, the memory stack 410 and the processor 420 may be connected through a TSV, and the processor 420 and a substrate 430 may be connected through a bump. In addition, the computing device 400 may have a fan-out structure in which an area of the substrate 430 (e.g., an area of the substrate 430 facing the processor 420) is greater than an area of the processor 420 (e.g., an area of the processor 420 facing the substrate 430) by a factor of several times.

Using the same equipment and specifications as the TSV applied to the memory stack 410, a TSV may be formed on a silicon back-side of the processor 420. For the face-up structure of the processor 420, although a TSV may be developed through separate equipment and specifications according to an I/O fan-out signal, it may be effective to configure a thermal dissipation path using an open space on an upper surface of the processor 420 in a thermal structure.

Considering that the substrate 430 has a large area to maximally use an I/O bandwidth both in the face-up structure and the face-down structure of the processor 420, it may be effective to select a method having a high production yield when the processor 420 and the memory stack 410 are combined in a process of manufacturing a chip-on-wafer-on-substrate (CoWoS).

The computing device 400 of the face-down structure may be combined by performing a processor yield test in a processor wafer state, generating a pad through back-side grinding of the processor 420, combining the memory stack 410 on a well-known good die and performing encapsulation, and then reversing the processor wafer and performing bumping and sawing.

FIG. 5 illustrates a computing device 500 of the face-up structure. In the computing device 500, a memory stack 510 may be disposed directly on a processor 520, and thus there may be no buffer (e.g., no buffer connected between the memory stack 510 and the processor 520).

In the computing device 500 of the face-up structure, a connection structure between the memory stack 510 and the processor 520 may be a structure in which a TSV connected to the memory stack 510 and an upper end pad of a face of the processor 520 may be connected by a micro-bump. In addition, the processor 520 may pass through the TSV to be connected to a substrate 530 by a bump through a lower end pad. The computing device 500 may have a structure that connects all signals fan-out to the substrate 530 by the TSV.

The computing device 500 of the face-up structure may be combined by performing a processor yield test in a processor wafer state, combining the memory stack 510 on a well-known good die and performing encapsulation, reversing the processor wafer and performing processor back-side grinding, and then performing bumping and sawing.

FIG. 6 illustrates a computing device 600 in a 2.5D structure. In the computing device 600, a memory stack 610 may be disposed on a buffer 620, and data stored in the memory stack 610 may be transmitted to a processor 640 through the buffer 620 and an interposer 630. The processor 640 and a substrate 650 may be connected through the interposer 630. The foregoing description of the computing device (e.g., the computing device 400 and the computing device 500) in the 3D structure may apply to the computing device 600, except that the computing device 600 further includes the buffer 610 and the interposer 630, and thus a more detailed and repeated description will be omitted here for conciseness.

In a computing device (e.g., 400, 500, or 600) described above with reference to FIGS. 4 through 6, an area of a substrate (e.g., 430, 530, or 650, respectively) may be greater than an area of a processor (e.g., 420, 520, or 640, respectively) by a factor of five or more times. A network interface specification of the computing device (e.g., 400, 500, or 600, respectively) may include a peripheral component interconnect express (PCIe) or compute express link (CXL) protocol.

FIGS. 7 through 11 illustrate an example of a high bandwidth based on a computing device.

Figure 7:
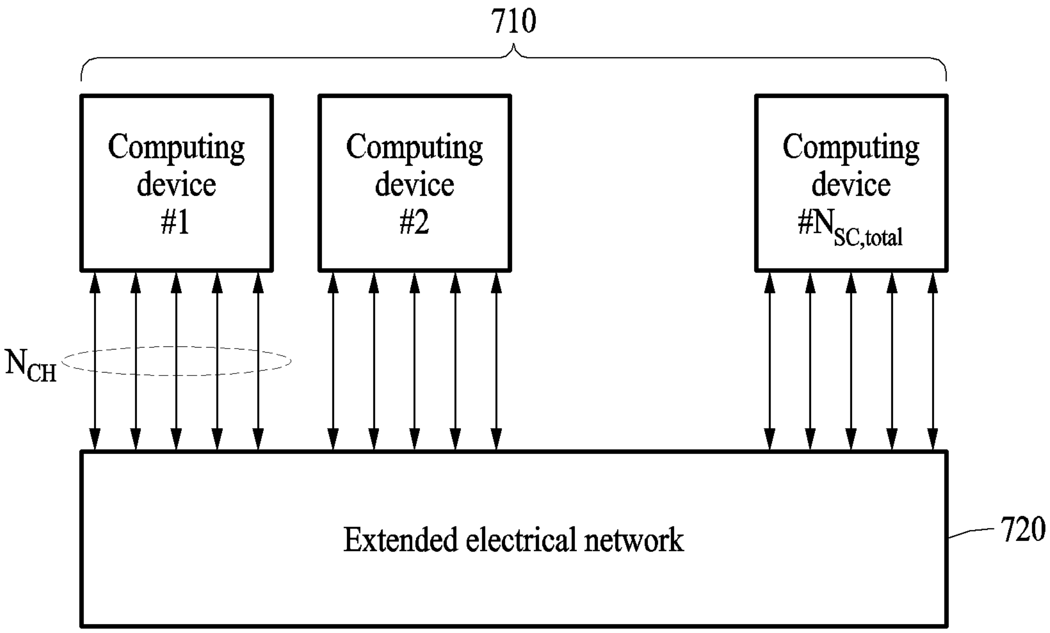
FIGS. 7 through 11 illustrate an example of a high bandwidth based on a computing device.
Figure 8:
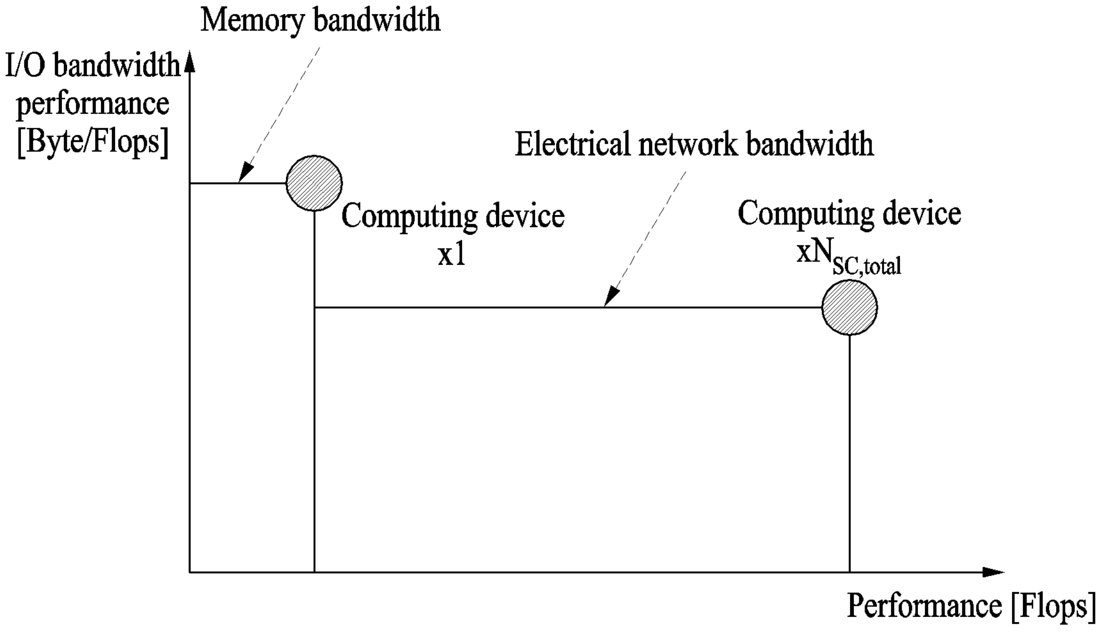

FIG. 7 illustrates a large-scale HBM resource using computing devices 710.

A scale-out system structure using a computing device may be implemented based on an extended electrical network 720. The computing devices 710 may be connected to each other using all channels $N_{CH}$. The extended electrical network 720 may be used to ensure a bandwidth per computational performance up to a maximum extendable scale, and to implement a large-scale memory resource through scale-out based on the computing devices 710. Through the scale-out expansion using the extended electrical network 720 based on a combination of a small chip and a high bandwidth I/O, a network bandwidth may maintain a similar performance to that of a memory bandwidth as verified in a byte-per-flop chart illustrated in FIG. 8. Thus, even when the scale is expanded by such an electrically connected network, a high I/O bandwidth efficiency per computational performance may be maintained and an effect may be obtained in terms of a large-scale application characteristic that data movements occur frequently.

Figure 9:
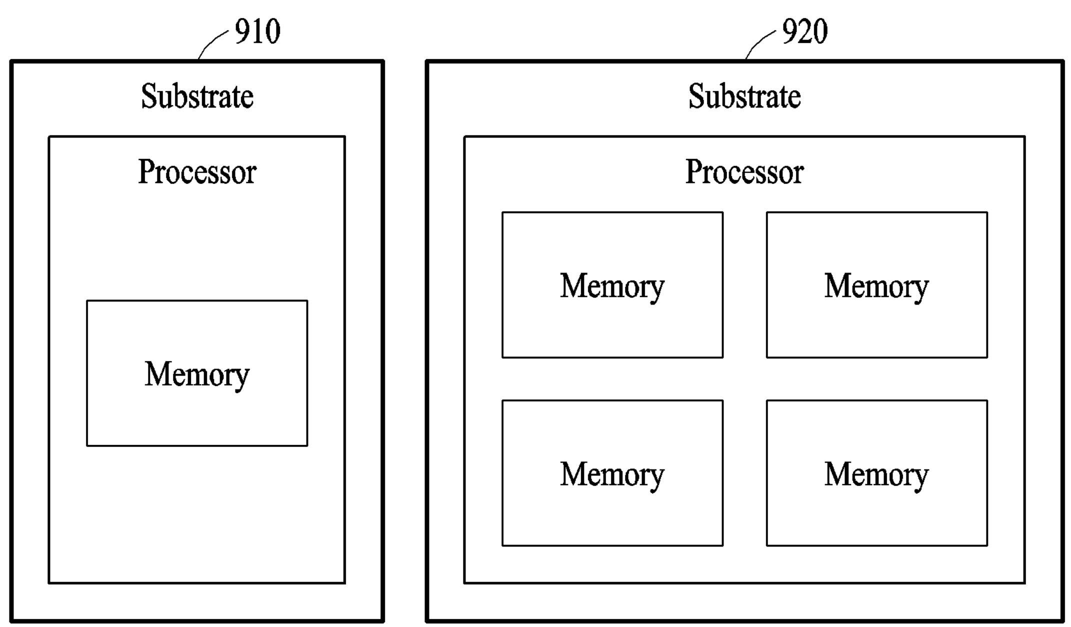

Referring to FIG. 9, a first computing device 910 may be a device that is constructed as a small chip including one memory and maximally applying a network bandwidth maximally using a substrate, and a second computing device 920 may be a device that is constructed as a big chip by disposing a greater number of memories on the same substrate and maximizing a memory bandwidth.

For example, the first computing device 910 may include one memory, an area of a processor of the first computing device 910 may be 1, an area of a substrate of the first computing device 910 may be 4, the second computing device 920 may include four memories, an area of a processor the second computing device 920 may be 2.5, and an area of a substrate the second computing device 920 may be fixed to be 4.

When there is an A system implemented by connecting eight memory systems and eight first computing devices, and there is a B system implemented by connecting eight memory systems and two second computing devices, results of comparing the A and B systems may be as follows in terms of a system performance and a bandwidth efficiency. Based on a single processor, the B system may have a memory bandwidth efficiency that is greater than that of the A system by a factor of 1.6 times (4/2.5=1.6) and have a computational performance that is greater than that of the A system by a factor of 2.5 times (2.5/1=2.5). However, when compared in terms of a scale-out system scale having the same memory capacity, the A system in which the eight processors are combined may have a network bandwidth efficiency that is greater than that of the B system in which the two processors are combined by a factor of 2.5 times and have a computational performance that is greater than that of the B system by a factor of 1.6 times (8/5=1.6). Thus, when evaluated in terms of a system that ensures a bandwidth per computational performance while maintaining a balance ratio in consideration of an I/O bandwidth when connecting various processors, the A system may be more effective in large-scale computation than the B system.

Figure 10:
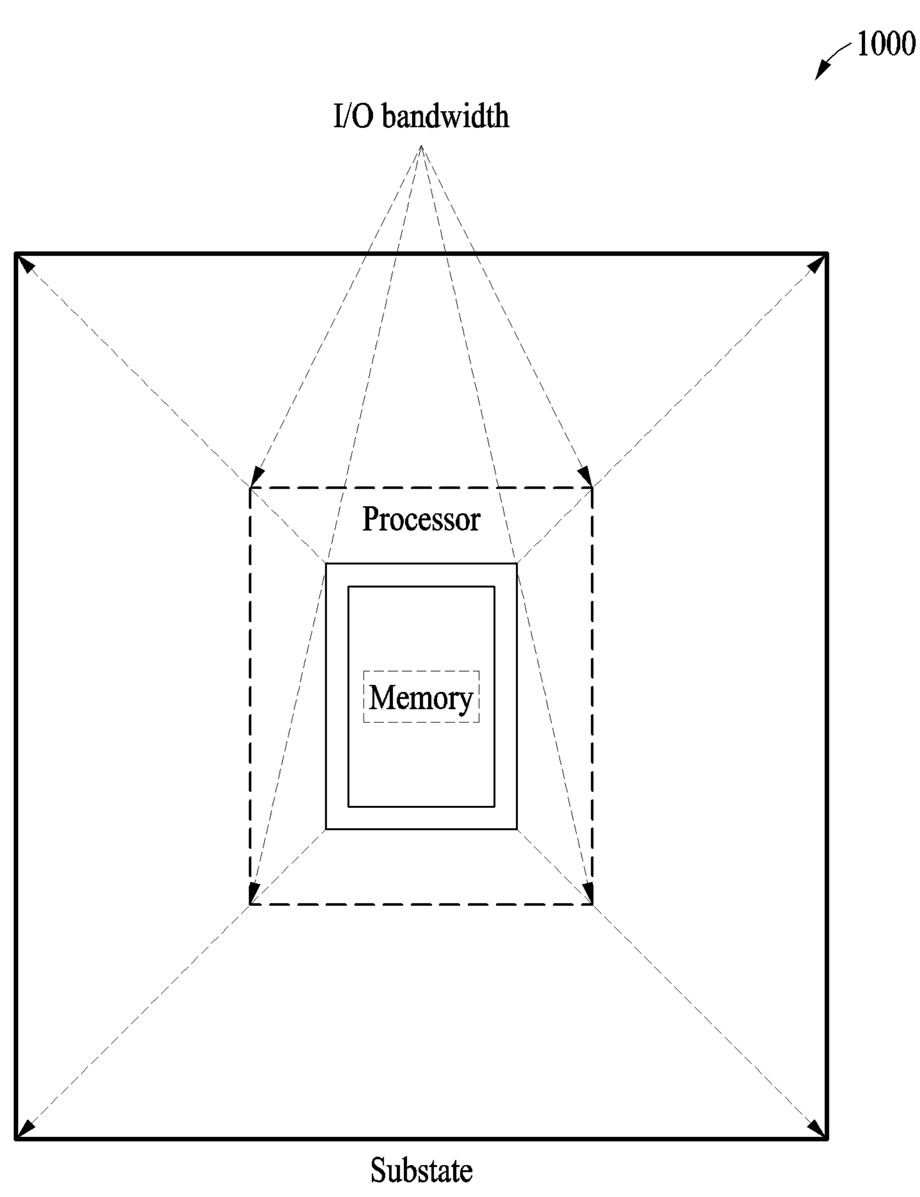
Figure 11:
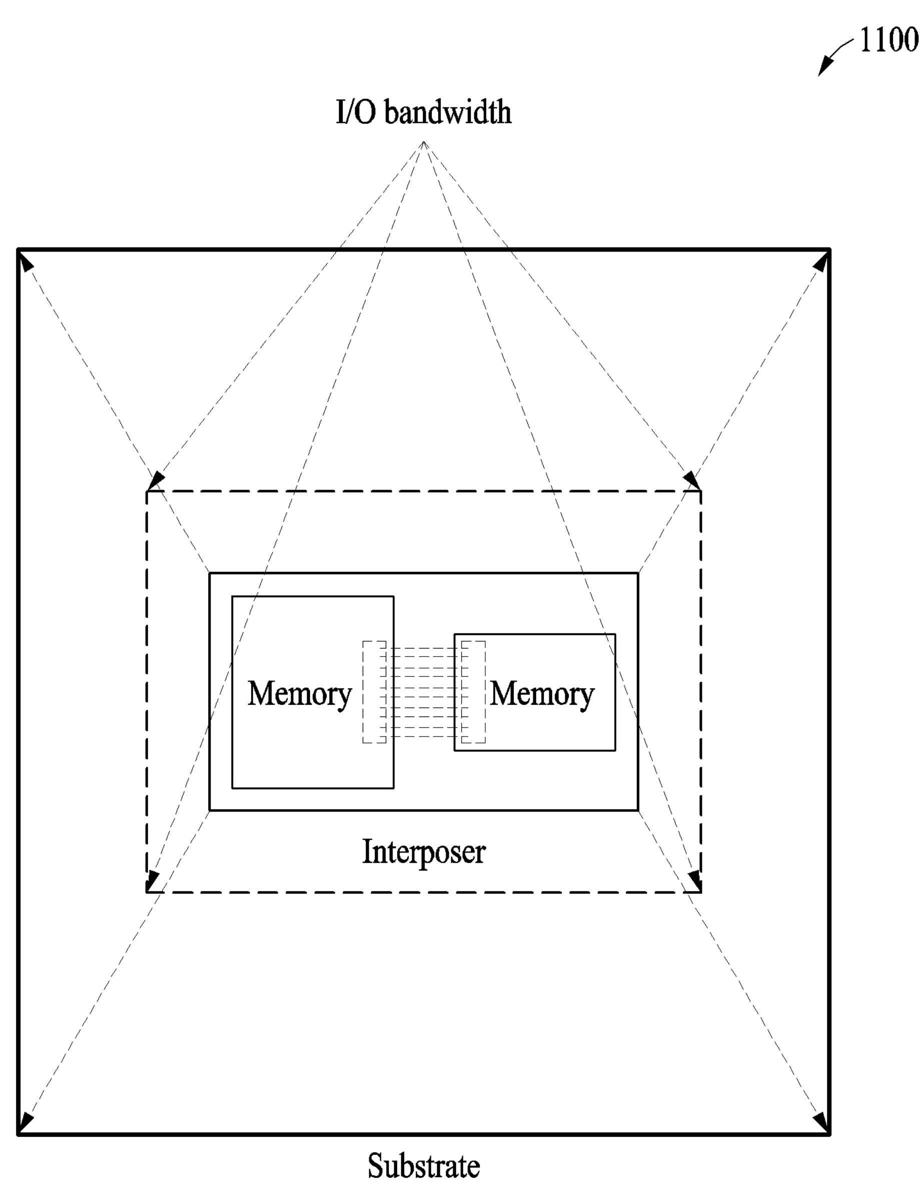

FIG. 10 illustrates an example of a computing device 1000 in a 3D structure, and FIG. 11 illustrates an example of a computing device 1100 in a 2.5D structure.

In an example of a computing device implemented as a big chip described above with reference to FIG. 9 (e.g., the second computing device 920), a physically available processor performance may be limited by the size of a processor, the size of a silicon interposer, and the size of a substrate. For example, although a scale of 12 memory stacks may be electrically connected, an expansion to a greater scale may be limited by an I/O bandwidth.

In contrast, optimizing a balance point of a computational performance, a memory bandwidth, and a network bandwidth between an HBM and a processor while focusing on securing an I/O bandwidth by a small chip may be more effective in scale-out system performance expansion although a single processor performance may be limited.

Figure 12:
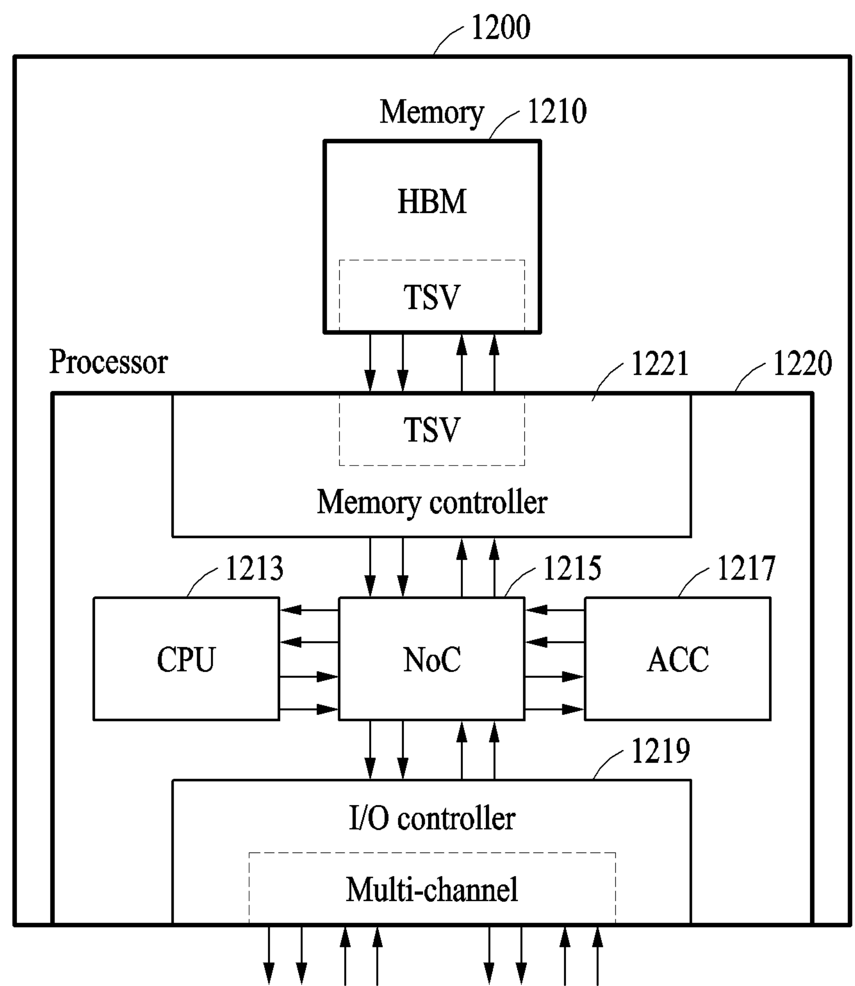
FIG. 12 illustrates an example of a computing device.

FIG. 12 illustrates an example of a computing device.

Referring to FIG. 12, a computing device 1200 may include a memory 1210 and a processor 1220. The computing device 1200, which may be a device configured for a memory bandwidth-intensive workload more than for a compute-intensive workload, may optimize the performance of the single processor 1220, according to the performance of a single HBM, and may maximize a network bandwidth. However, the computing device 1200 is not limited thereto.

Although the computing device 1200 is illustrated in FIG. 12 as including a single memory and a single processor, examples are not limited thereto. In other non-limiting examples, the computing device 1200 may include a plurality of memories and a single processor, or a plurality of memories and a plurality of processors.

A memory bandwidth may be determined in a connection structure between the memory 1210 and the processor 1220.

A computational performance of the computing device 1200 may be determined by a size and structure of the processor 1220, and the network bandwidth may be determined by an I/O structure connected to the outside of the computing device 1200.

The memory 1210 may include an HBM including a 3D DRAM stack, and may be connected to the processor 1220 through a plurality of TSVs and a memory controller 1221. The processor 1220 may include a CPU 1213 performing general-purpose operations, an accelerator (ACC) 1217 specified to a specific type of operations, a network-on-chip (NoC) 1215 connecting internal components of the processor 1220, and an I/O controller 1219 connecting external system components of the processor 1220. The I/O controller 1219 may be extendable to multiple channels to allocate a specific or higher bandwidth.

Figure 13:
FIGS. 13 and 14 illustrate an example of an electronic device.
Figure 13:
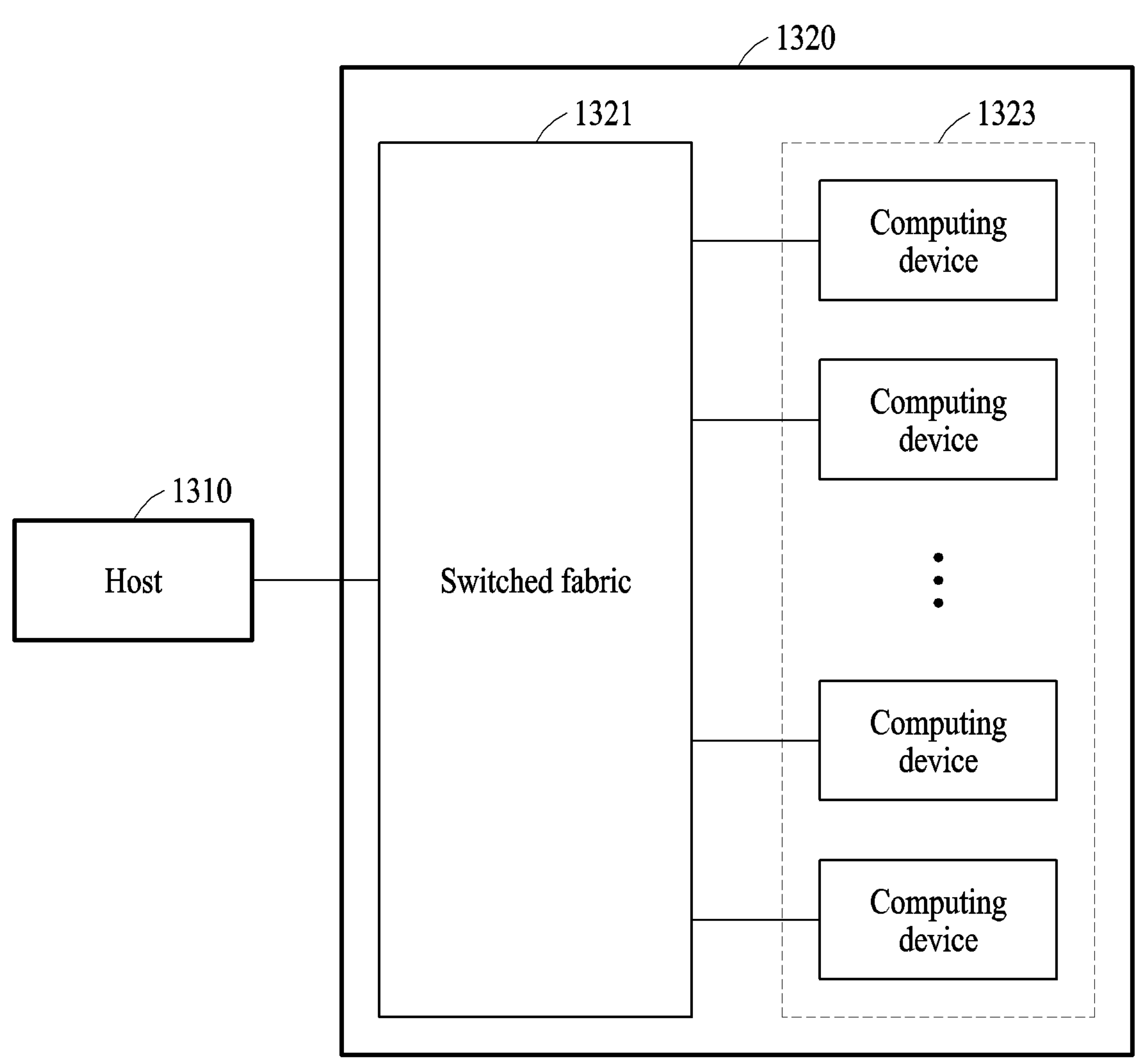
Figure 14:
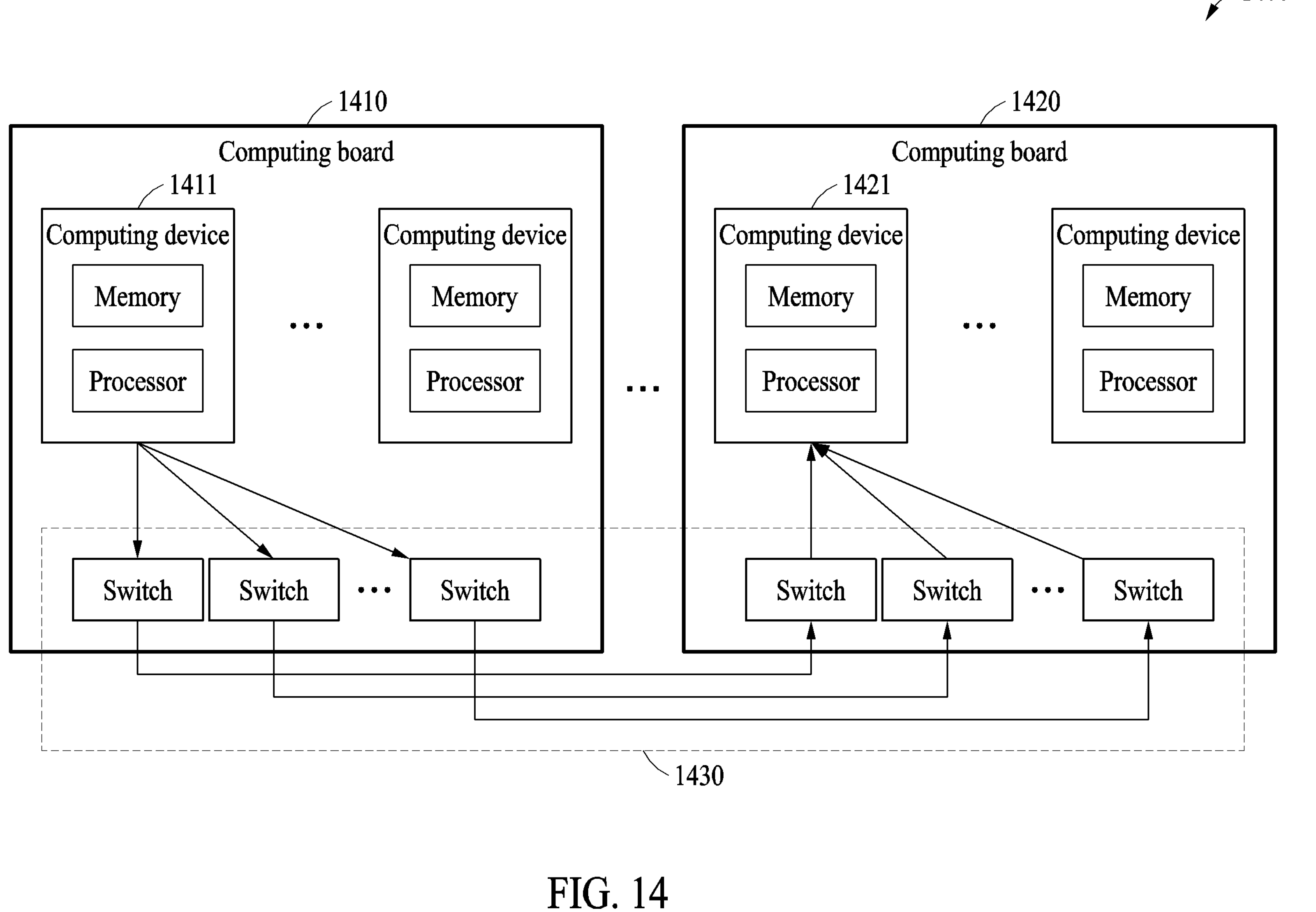

FIGS. 13 and 14 illustrate an example of an electronic device.

Referring to FIG. 13, an electronic device 1300 may include a host 1310 and a computing node 1320. The host 1310 may refer to a device configured to control the computing node 1320 and may, for example, control transmission of data from any one of a plurality of computing devices 1323 to another one of the computing devices 1323.

The electronic device 1300 may refer to a device that connects the computing devices 1323 through a multi-stage electrical interconnection network. The electronic device 1300 may be or include, for example, any one or any combination of any two or more of various devices such as a high-performance computing (HPC) device, a desktop, a workstation, and a server. The electrical interconnection network may be configured by electrical wiring on a printed circuit board (PCB), and may be more cost-effective and simplified compared to an optical interconnection network that consumes high power by electrical-to-optical signal conversion and high cost by optical cables. In the electrical interconnection network, a connectable distance may be limited as a signal speed increases to tens of gigahertz (GHz) and an insertion loss increases thereby. Such a limitation of the connectable distance may be removed by a multi-stage switched fabric 1321 to be described hereinafter. The electronic device 1300 may support a large-scale computing device pool in consideration of physical characteristics of the electrical interconnection network.

The switched fabric 1321 may include a plurality of switches connecting the computing devices 1323. When transmitting data from one of the computing devices 1323 to another one of the computing devices 1323, the switched fabric 1321 may transmit the data by splitting the data through switches connected through the electrical interconnection network, thereby effectively maintaining the performance of a bandwidth between the computing devices 1323.

The switches included in the switched fabric 1321 may be grouped, along with the computing devices 1323, into a plurality of groups, and a range of a single computing node (e.g., the computing node 1320) may be extended through the maximization of a connection between the computing devices 1323 through the multi-stage electrical interconnection network divided into an intra-group and an inter-group of the plurality of groups. The range of the computing node 1320 may be extended according to a design target for applications of the electronic device 1300.

Although the electronic device 1300 is illustrated in FIG. 13 as including one computing node (e.g., the computing node 1320) for the convenience of description, examples are not limited thereto. In other non-limiting examples, the electronic device 1300 may include a plurality of computing nodes. In these examples, the computing nodes included in the electronic device 1300 may be connected through the optical interconnection network.

Also, the electronic device 1300 may further include a storage, a disaggregated resource such as a nonvolatile memory, an optical network, and an additional system and network for management.

The electronic device 1300 may extend the range (e.g., the connectable distance) of the computing node 1320 through an extended electrical interconnection network in which a plurality of switches is connected in the form of a fabric, thereby effectively maintaining a high bandwidth performance even without using the optical interconnection network that uses an expensive optical cable.

Referring to FIG. 14, a computing node 1400 may include a plurality of computing boards 1410 and 1420.

A plurality of computing devices and a plurality of switches included in the computing node 1400 may be grouped into a plurality of groups. A plurality of computing devices and switches grouped into the same group may be disposed on one computing board. For example, the number of computing devices included in each of the groups may be the same. The number of switches included in each of the groups may also be the same.

A computing device may include a memory and/or a processor. The memory may be a device for storing therein data and may be, for example, an HBM. The processor may be a device that performs a computation or operation and may be or include, for example, an xPU such as a CPU, a graphics processing unit (GPU), a neural processing unit (NPU), and a tensor processing unit (TPU), and/or a field-programmable gate array (FPGA) or the like.

A connection between a computing device and a switch in the same computing board and a connection between switches in different computing boards may be based on an electrical interconnection network. For example, when data is transmitted from a first computing device 1411 included in a first computing board 1410 to a second computing device 1421 included in a second computing board 1420, split data may be transmitted from the first computing device 1411 to the second computing device 1421 through a switched fabric 1430. In this example, the first computing device 1411 may transmit the split data to first switches included in the first computing board 1410 and the switched fabric 1430, and the first switches may transmit the split data to second switches included in the second computing board 1420 and the switched fabric 1430. The second switches may then transmit the split data to the second computing device 1421. Through this, such a data transmission may not be limited by a bandwidth according to the electrical interconnection network. As a non-limiting example to be described later with reference to FIGS. 15 and 16, the first computing device 1411 may be connected to all the first switches included in the first computing board 1410, and the first switches may be respectively connected to the second switches one-to-one. Also, all the second switches included in the second computing board 1420 may be connected to the second computing device 1421.

The structure of the switched fabric 1430 may effectively maintain an input and output (I/O) bandwidth performance between all computing devices in the computing node 1400, which will be described later in detail with reference to FIGS. 15 and 16.

Figure 15:
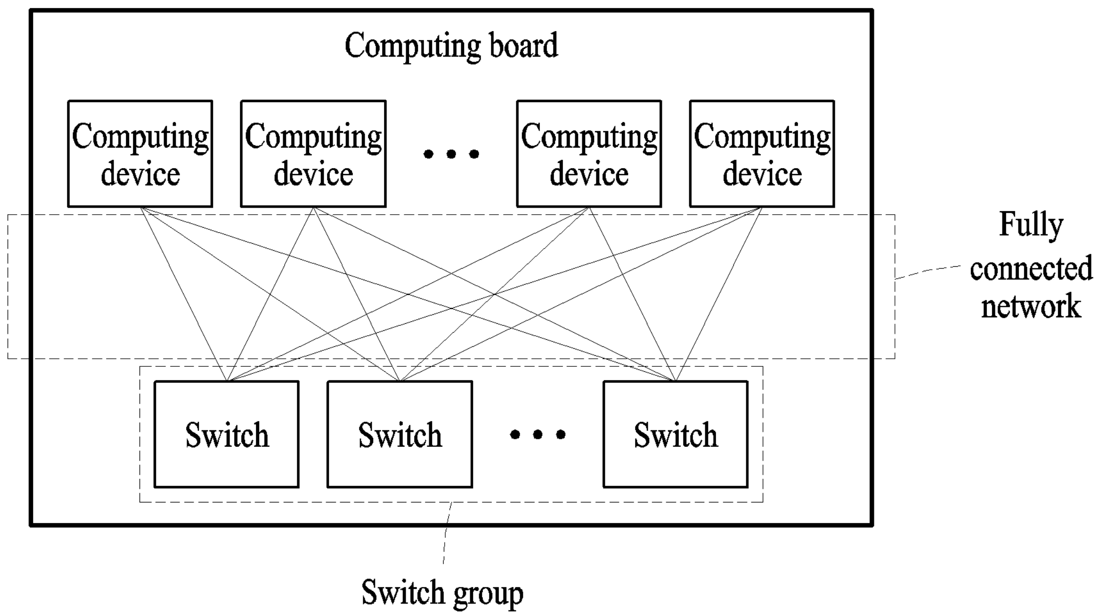
FIG. 15 illustrates an example of a connection in a computing board.

FIG. 15 illustrates an example of a connection in a computing board.

Referring to FIG. 15, a plurality of computing devices and switches in a computing board may be grouped into the same group and fully connected to each other. Each of the computing devices may be electrically connected to all the switches in the same group. For example, each of the computing devices may be connected to the switches with the same bandwidth, but examples are not limited thereto. Each of the switches may also be connected to all the computing devices in the same group. Likewise, each of the switches may be connected to the computing devices with the same bandwidth, but examples are not limited thereto.

For example, in the same group, a computing device may not be connected to every other computing device, and a switch may not be connected to every other switch. That is, in the same group, one computing device may not be connected to another computing device, and one switch may not be connected to another switch.

As illustrated in FIG. 15, a plurality of switches in a single computing board may be referred to as a switch group.

Figure 16:
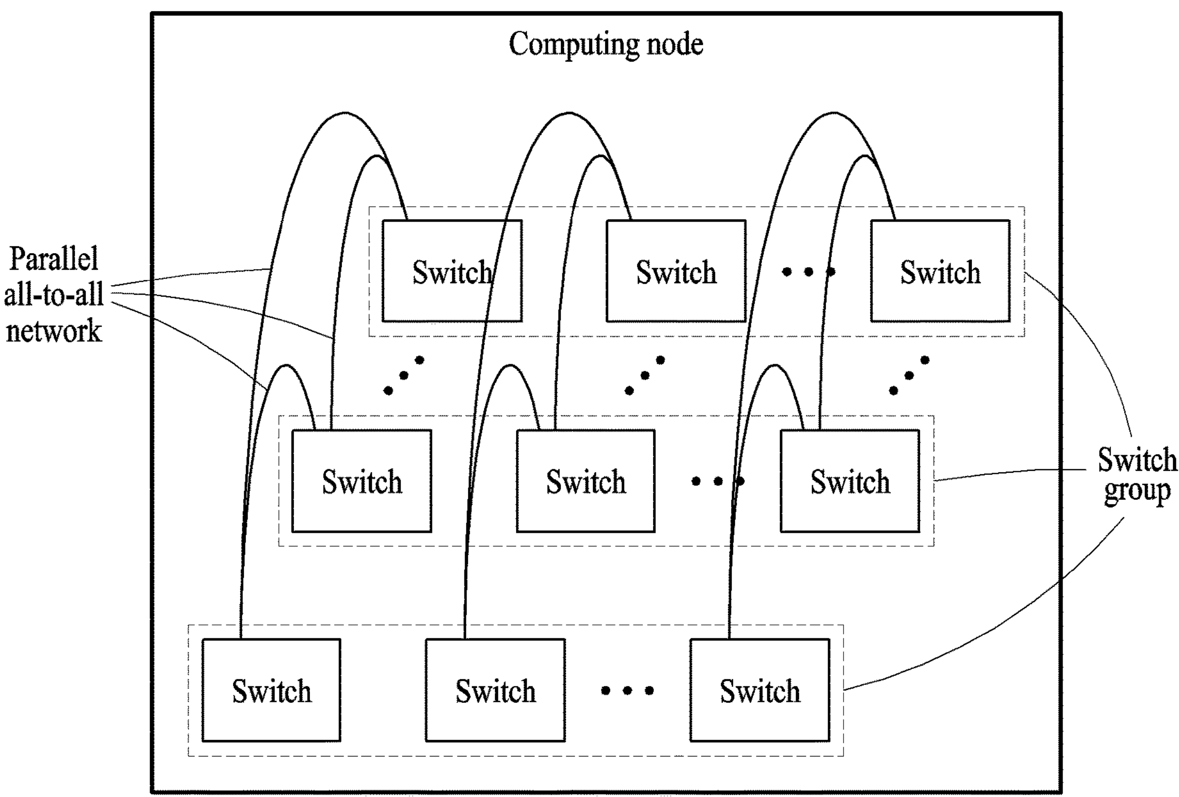
FIG. 16 illustrates an example of a connection between computing boards.

FIG. 16 illustrates an example of a connection between computing boards.

Referring to FIG. 16, a plurality of switch groups in a computing node may be connected in parallel all-to-all. Each of the switch groups may include switches included in the same computing board. A connection between the switch groups illustrated in FIG. 16 may represent an electrical connection between switches in different computing boards.

Each of switches included in one group may be exclusively connected to any one of switches included in another group. For example, an n-th switch included in one group may be exclusively connected to an n-th switch among switches included in another group, and may not be connected to the other switches. For example, a first switch included in a first group may be connected to first switches respectively included in second through k-th groups, and the first switches included in the first through the k-th groups may be connected to each other with the same bandwidth. In this example, n and k denote natural numbers.

However, the foregoing examples are provided only for the convenience of description, and examples are not limited thereto. For example, an n-th switch included in a first group may not be necessarily connected to an n-th switch included in a second group, but may be connected to any one of switches included in the second group. Also, the n-th switch may not be simultaneously connected to another switch that is not the n-th switch included in the second group. A network having such a connection structure may be referred to as a parallel all-to-all network.

Figure 17:
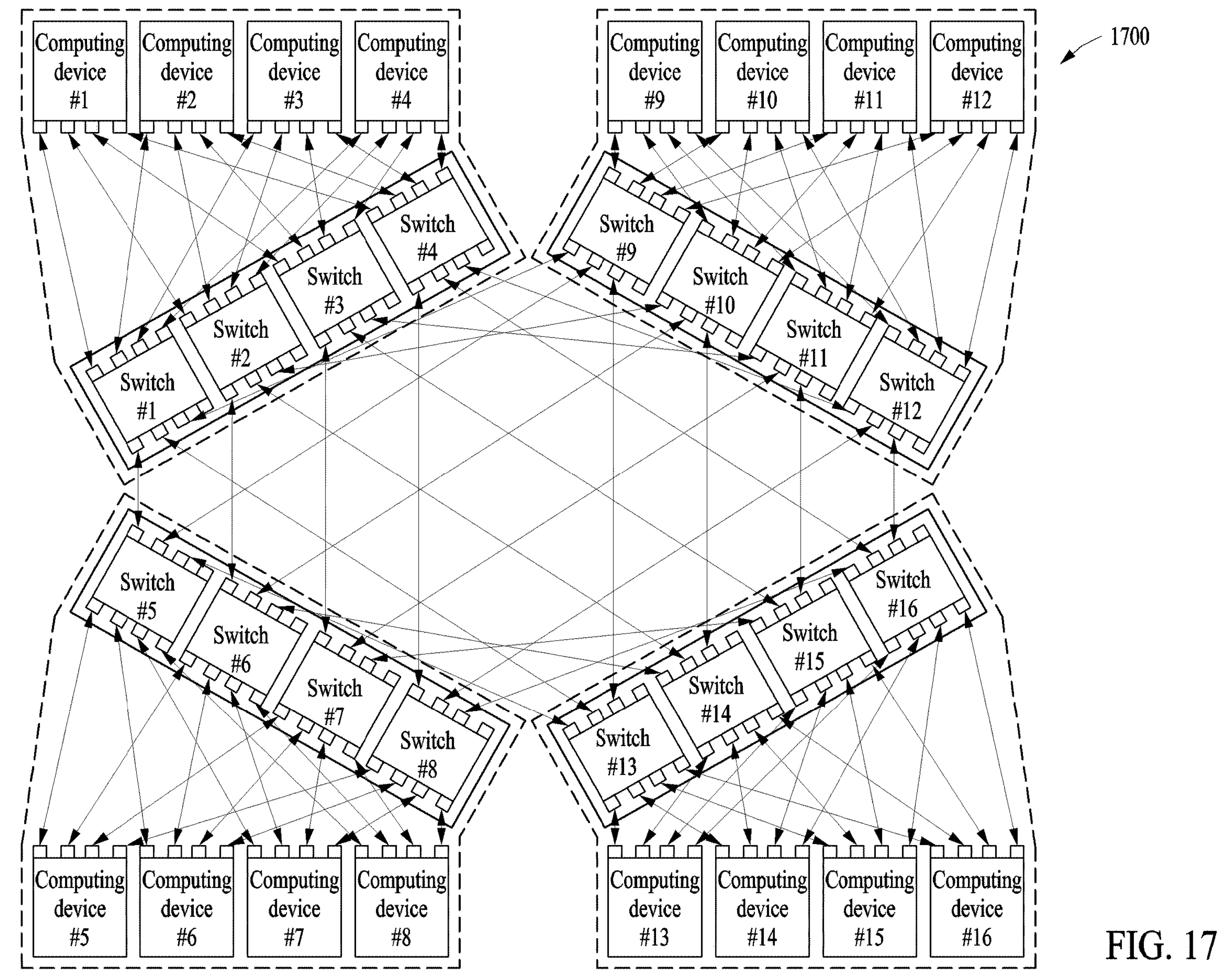
FIG. 17 illustrates an example of a connection structure of a computing node.

FIG. 17 illustrates an example of a connection structure of a computing node.

Referring to FIG. 17, a plurality of computing devices and switches included in a computing node 1700 may be grouped into a plurality of groups (e.g., where each group is enclosed by a dashed line). Each of the groups may correspond to a computing board.

For example, $K_{CD}$ (=16 lanes, e.g., a 16-lane computing node, 4 lanes per line as illustrated in FIG. 17) and $K_{SW}$ (=32 lanes, e.g., 32-lane switch) may be used to configure a target computing node of the size with $N_{CD\_total}$ (=16 nodes) and PCIe Gen 5 ($BW_{lane}$=4 GB/s, one-way bandwidth)-based $BW_{target}$ (=1,024 GB/s).

A total number of switches used to accommodate a bandwidth for the entire computing node may be greater than or equal to the number of switches used to connect a haft of a total switch bandwidth to the computing node under the assumption that an uplink-to-downlink ratio for a single switch is one-to-one (1:1). For a single switch, a downlink may indicate a connection to the computing node, and an uplink may indicate a connection to another switch.

$$N_{SW\_total} \geq BW_{target}/(BW_{SW}/2) = 2 \times BW_{target}/(BW_{lane} \times K_{SW}) = 2 \times 1{,}024/(4 \times 32) = 16$$

The size $N_{SW}$ of a switch group may be determined by dividing a total number of available lanes in a single computing node by the number of lanes per channel.

$$N_{SW} = K_{CD}/L_{CH} = 16/4 = 4$$

The number $N_{SW\_group}$ of required switch groups may be determined by dividing a total number of switches by the size of a switch group.

$$N_{SW\_group} = N_{SW\_total}/N_{SW} \geq 16/4 = 4$$

For a connection of an intra-group (a computing device-to-switch connection in the same group) and an inter-group (a switch-to-switch connection in different groups), the connection may be constructed to ensure the number of lanes per channel when connecting all computing nodes based on the number (e.g., $L_{CH}$=4) of lanes per channel. In this example, a flatten butterfly structure may be used to minimize the number of required switches.

For example, as illustrated in FIG. 17, the computing devices and the switches included in the computing node 1700 may be grouped into four groups, and each of the groups may include four computing devices and four switches.

Each of the computing devices may have 16 lanes, and each of the lanes may be connected, one by one, to the four switches in the same group. Each of the switches may have 32 lanes, among which 16 lanes may each be connected, one by one, to the four computing devices in the same group. The computing devices and the switches in the same group may be fully connected through an electrical interconnection network.

Switches in different groups may be connected in parallel all-to-all through the electrical interconnection network. Each of switches included in one group may be exclusively connected to any one of switches included in another group. For example, a first switch in a first group may be exclusively connected to a fifth switch among switches in a second group, and may not be connected to sixth to eighth switches in the second group. Likewise, the fifth switch in the second group may be exclusively connected to the first switch among switches in the first group, and not be connected to second to fourth switches in the first group.

For example, a situation where a first computing device in the first group transmits data to a fifth computing device in the second group will be described as follows. The first computing device may split the data into four segments and transmit the four segments to the first to fourth switches at the same bandwidth. The first to fourth switches may transmit the received data to switches respectively connected to the first to fourth switches one-to-one among the fifth to eighth switches in the second group. The fifth to eighth switches may transmit the received data to the fifth computing device in the second group. Through a one-to-one connection between computing devices and switches and a one-to-one connection between switches in different groups, the computing node 1700 of one or more embodiments may efficiently transmit data without a limitation by an I/O bandwidth.

In the example of FIG. 17, each switch uses 28 lanes among the 32 lanes, and thus the computing node 1700 may further include one additional group using the four lanes remaining in each switch. In this way, adding a group considering an allowable range of lanes for switches may readily extend a range of the computing node 1700.

In the example of FIG. 17, a ratio between the uplink through which each switch is connected to switches in different groups and the downlink through which each switch is connected to computing devices in the same group may be 1:1, but examples are not limited thereto. For example, when a bandwidth allocation ratio of each switch for the uplink and the downlink is changed to 1:N, N/(N+1) of a bandwidth of each switch may be allocated to the computing devices in the same group. In this example, when N is greater than 1 (N=2, 3, etc.), the number of computing devices connected to each switch may increase, but the number of groups connected to a corresponding switch may decrease. Conversely, when N is less than 1 (N=½, ⅓, ¼, etc.), the number of computing devices connected to each switch may decrease, but the number of groups connected to a corresponding switch may increase. In the example of FIG. 24, N=1 and, in such an example, the number of connectable nodes with a minimum number of switches may be maximized.

For example, a total number $K_{SW}$ of ports of each switch may be determined to be $N_{DN}\times L_{DN}+N_{UP}\times L_{UP}\leq K_{SW}$. In this example, $N_{DN}$ denotes the number of channels in the downlink, $L_{DN}$ denotes the number of lanes per channel in the downlink, and $N_{UP}$ denotes the number of lanes per channel in the uplink and $L_{UP}$ denotes the number of lanes per channel in the uplink.

The structure and the communication method of one or more embodiments described above may extend a switch connection and readily increase the number of groups. In addition, the intra-group or inter-group connection of one or more embodiments may expand a bandwidth with a single computing device, and split a bandwidth between various computing devices. When computing devices are selected from the intra-group and the inter-group, a bandwidth between the computing devices may be split. In addition, using switches in the intra-group and the inter-group, a computing device may be selected unconstrainedly from within a given bandwidth, and thus a required bandwidth may be split and used.

Figure 18:
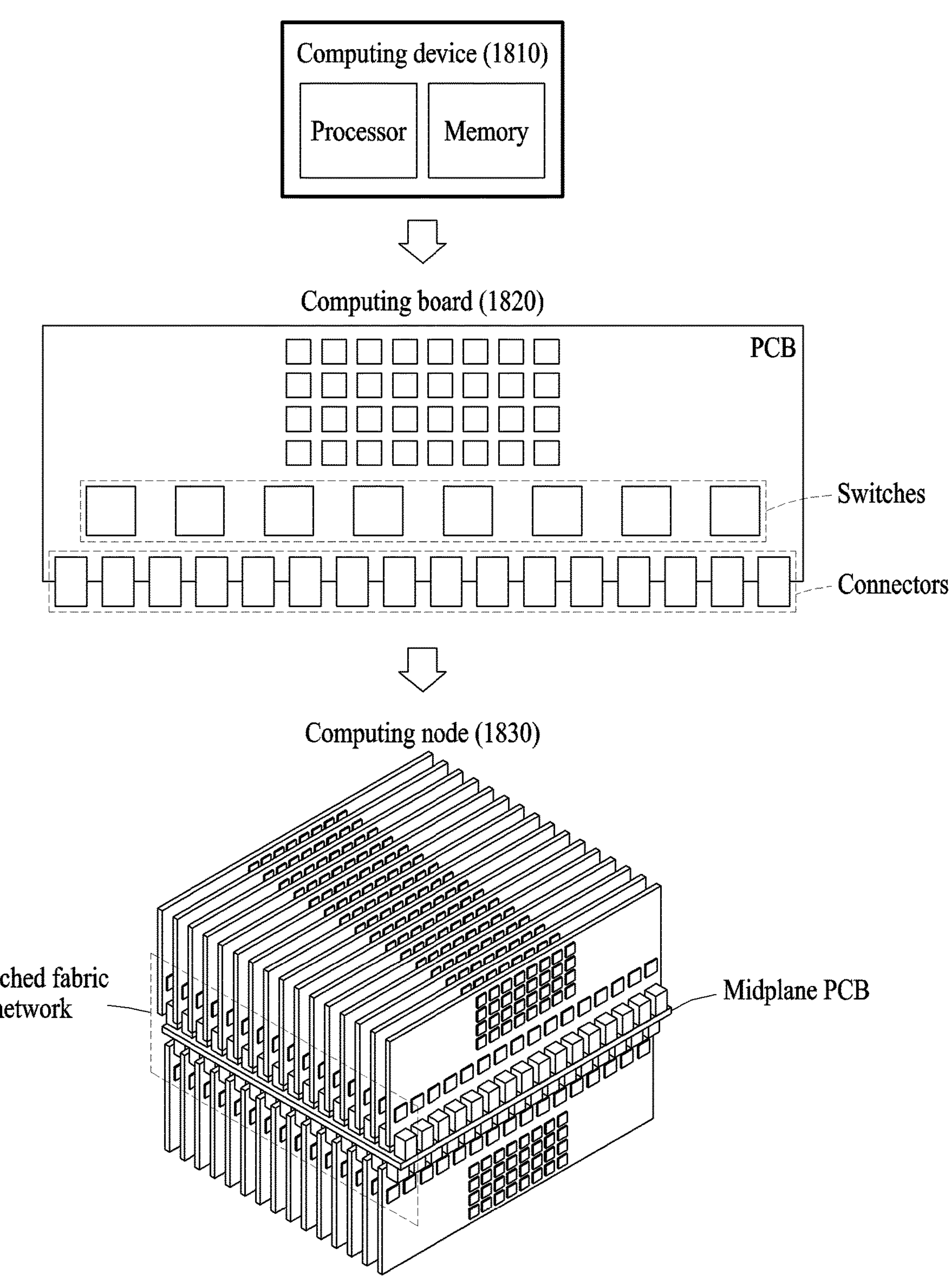
FIG. 18 illustrates an example computing device, an example computing board, and an example computing node.

FIG. 18 illustrates an example computing device, an example computing board, and an example computing node.

Referring to FIG. 18, illustrated are examples of a computing device 1810, a computing board 1820, and a computing node 1830.

The computing board 1820 may include, in a single PCB, a plurality of computing devices and switches, within an available range of a link budget of an electrical interface. For example, in an example of PCIe Gen 5 (e.g., bit rate:32 GT/s), the computing board 1820 may be constructed such that a computing device-PCIe switch trace length is less than or equal to 460 mm according to a MEGTRON6 PCB standard, based on a −36 dB loss budget.

In the example of FIG. 18, the computing board 1820 may include 32 computing devices, 16 switches (eight switches on each of front and rear surfaces of the computing board 1820), and 16 connectors. The connectors may electrically connect the computing board 1820 to a midplane PCB of the computing node 1830. Although the midplane PCB is illustrated in FIG. 18 for the convenience of description, examples are not limited thereto and a backplane PCB may also be applicable unconstrainedly.

The computing node 1830 may connect a plurality of computing boards to the midplane PCB using connectors, within an allowable range of a link budget. The link budget may be reset at a time of switch passage.

A total I/O bandwidth of the switches in the computing board 1820 may be constructed to be greater than or equal to a value of (a total I/O bandwidth of computing devices in the computing board 1820)+(the number of computing boards in the computing node 1830×an I/O bandwidth of a single computing device).

All the switches in the computing board 1830 may be electrically connected through a switched fabric network. The computing node 1830 may support a large-scale HBM pool by maximizing a PCB-applied electrical interconnection network.

Figure 19:
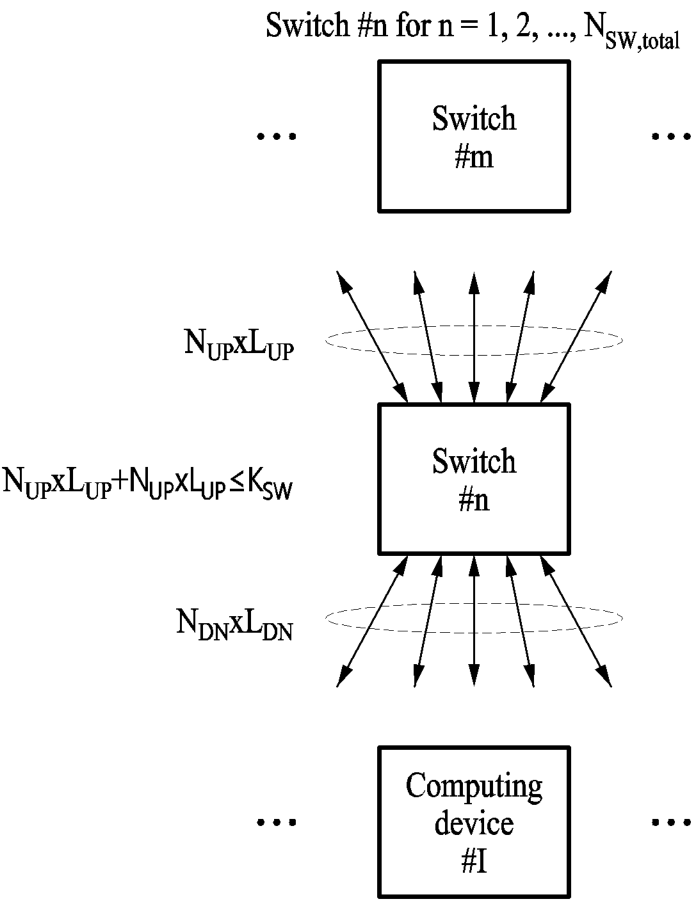
FIG. 19 illustrates an example of the number of available lanes and the number of ports of a switch.

FIG. 19 illustrates an example of the number of available lanes and the number of ports of a switch.

An extended electrical network for connecting a plurality of computing devices may include $N_{SW,total}$ switched fabric networks. A total number $K_{SW}$ of lanes or ports required in a single switch may be determined based on the number $N_{DN}$ of channels and the number $L_{DN}$ of lanes per channel that are based on the number of computing devices to be connected downlink, and based also on the number $N_{UP}$ of channels and the number $L_{UP}$ of lanes per channel that are based on the number of switches to be connected uplink. The extended electrical network may be implemented with $N_{DN}\times L_{DN}+N_{UP}\times L_{UP}\leq K_{SW}$ or more switches.

FIGS. 20 through 23 illustrate examples of a computing device.

Figure 20:
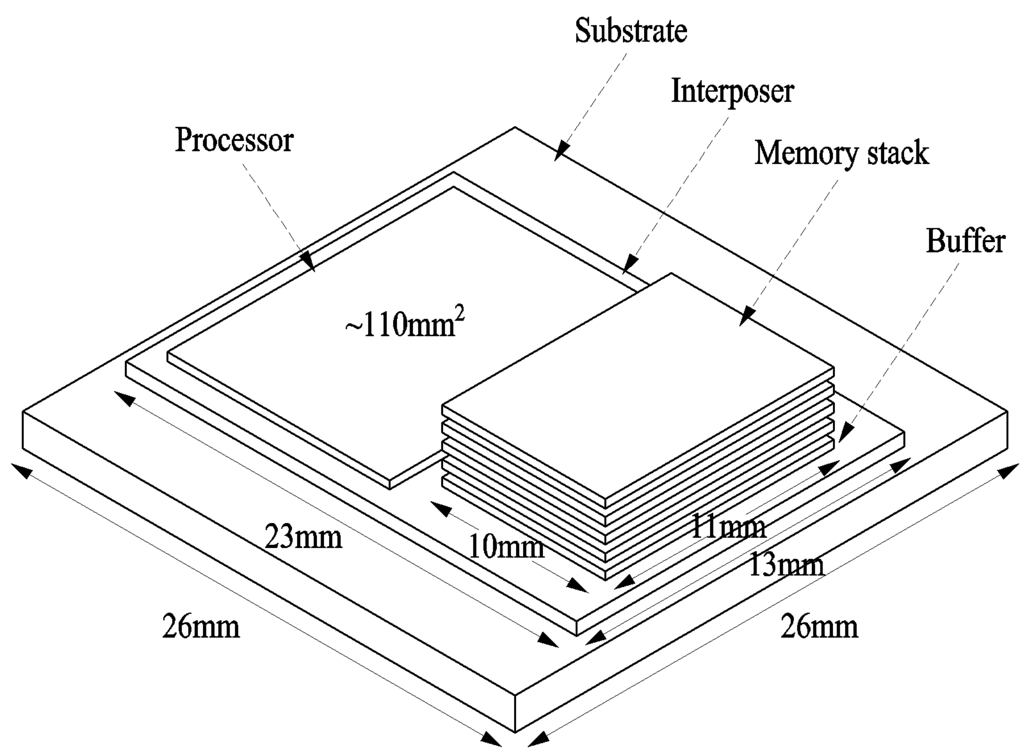
FIGS. 20 through 23 illustrate examples of a computing device.
Figure 21:
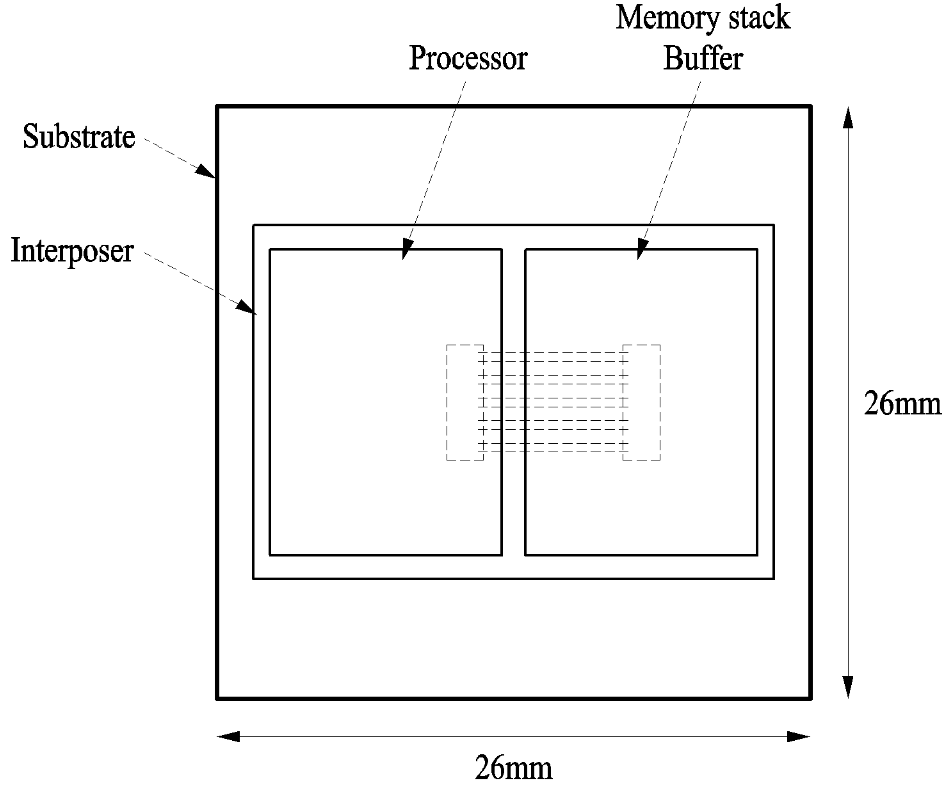
Figure 21:
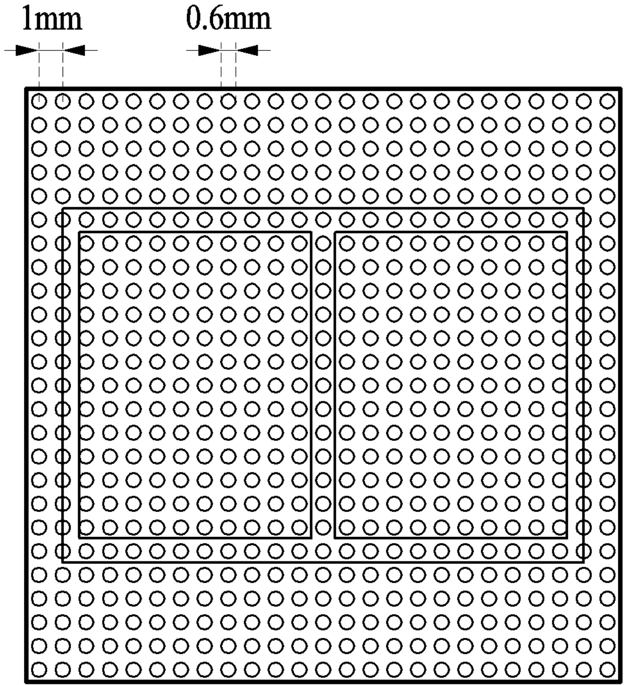

FIGS. 20 and 21 illustrate an example computing device constructed to be a 2.5D structure. Detailed numerical values illustrated in FIGS. 20 and 21 are provided as examples for the convenience of description, and they are not limited to the examples. Based on a memory stack size of 11×10 $mm^2$, the computing device of the 2.5D structure may have an I/O configuration (substrate size 26×26 $mm^2$, 1 mm pitch 0.6 mm diameter ball 25×25 array). The substrate size which is 676 $mm^2$ (26×26 $mm^2$=676 $mm^2$) may be approximately 2 times an interposer size (23×13=299 $mm^2$) and be approximately 6 times a processor size (11×10=110 $mm^2$).

Figure 22:
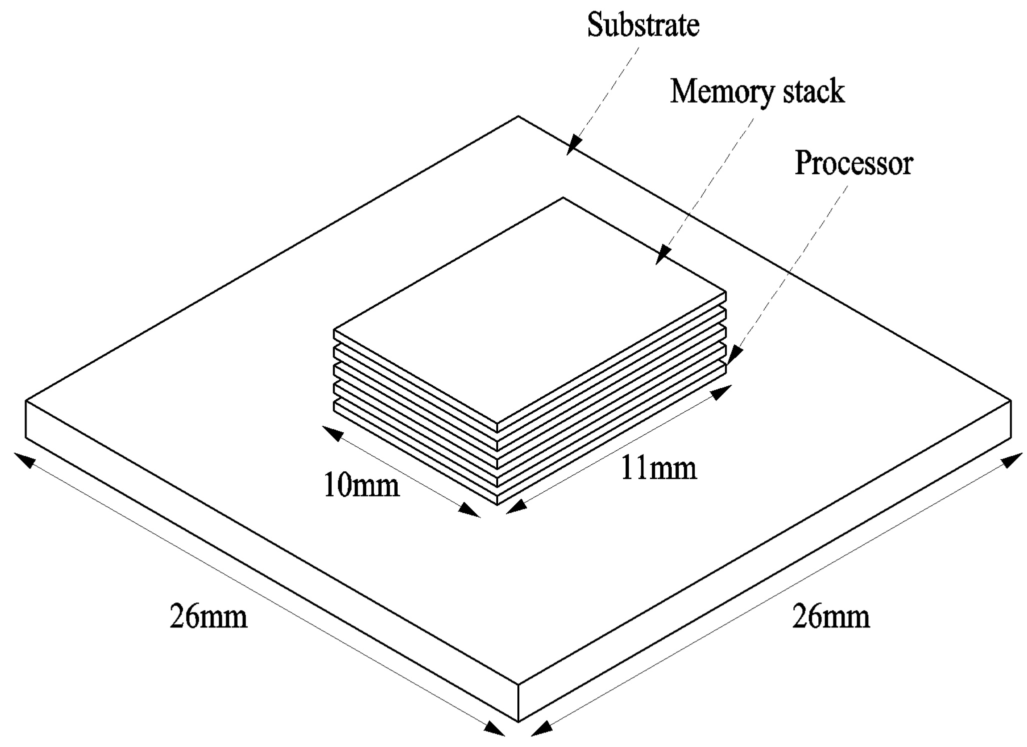
Figure 23:
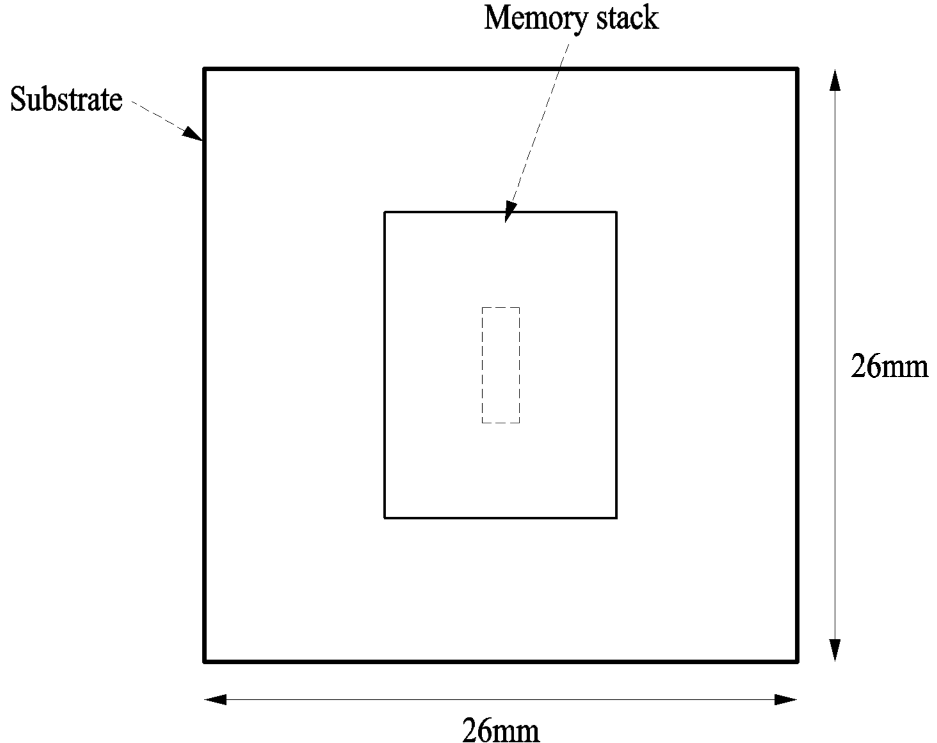
Figure 23:
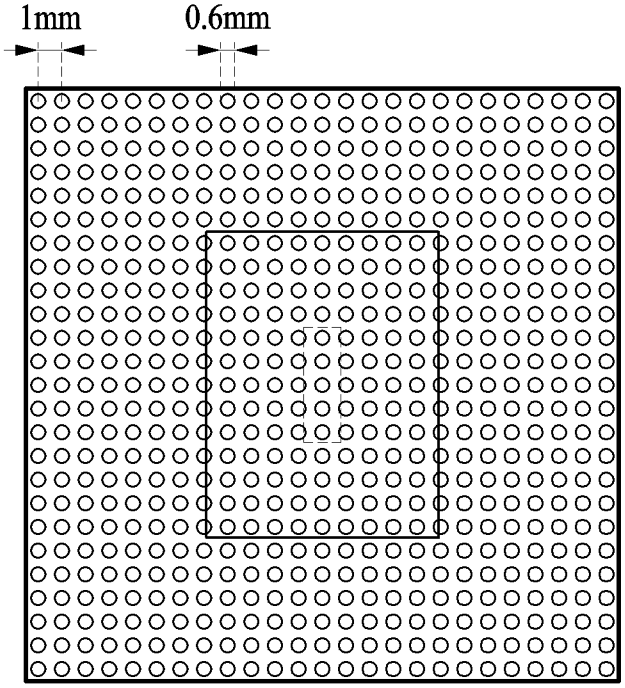

FIGS. 22 and 23 illustrate an example computing device constructed to be a 3D structure. Detailed numerical values illustrated in FIGS. 22 and 23 are provided as examples for the convenience of description, and they are not limited to the examples. When the computing device of the 3D structure maintains an I/O configuration (1 mm pitch 0.6 mm diameter ball 25×25 array) based on a substrate size of 26×26 $mm^2$, the substrate size which is 676 $mm^2$ (26×26=676 $mm^2$) may be approximately 6 times a processor size (11×10=110 $mm^2$). Thus, using an extra space through a fan-out structure in which an area of a substrate is wider than an area of a processor by a factor of several times, a connection structure at a lower end of the processor may be used only to the extent required to secure a network bandwidth, and a balanced point of the network bandwidth may thus be secured.

When a memory resource is expanded using a computing device of one or more embodiments described above, a processor in the computing device may perform computation at a position near a memory stack, and thus a high-band memory performance may be used in the computing device. In addition, when connecting computing devices, a network bandwidth efficiency per computational performance may be desirable, and shared memory access performance may be ensured by a distributed memory structure of the computing devices.

The computing devices, processors, memories, storages, memory stacks, substrates, single memory stacks, buffers, interposers, electrical networks, first computing devices, second computing devices, CPUs, NoCs, ACCs, I/O controllers, memory controllers, electronic devices, hosts, computing nodes, switched fabrics, computing boards, computing device 100, processor 110, memory 120, storage 130, computing device 200, memory stack 210, processor 220, substrate 230, computing device 300, single memory stack 310, single processor 320, computing device 400, memory stack 410, processor 420, substrate 430, computing device 500, memory stack 510, processor 520, substrate 530, computing device 600, memory stack 610, buffer 620, interposer 630, processor 640, substrate 650, computing devices 710, electrical network 720, first computing device 910, second computing device 920, computing device 1000, computing device 1100, computing device 1200, memory 1210, processor 1220, CPU 1213, NoC 1215, ACC 1217, I/O controller 1219, memory controller 1221, electronic device 1300, host 1310, computing node 1320, switched fabric 1321, computing devices 1323, computing node 1400, computing boards 1410 and 1420, first computing device 1411, second computing device 1421, switched fabric 1430, computing node 1700, and other apparatuses, units, modules, devices, and components described herein with respect to FIGS. 1-23 are implemented by or representative of hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-23 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above, The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

What is claimed is:

1. A device comprising:
- a processor connected to a memory stack in which memories connected to the processor are stacked,
- wherein the processor is connected to the memory stack through a through-silicon via (TSV), and
- wherein a memory bandwidth established through the TSV between the processor and the memory stack is five or less times a network bandwidth between the processor and a substrate disposed under the processor.

2. The device of claim 1, wherein
- a computational performance of the processor is determined based on an area of the processor, and
- the network bandwidth per the computational performance of the processor is greater than or equal to 0.1 bytes per flop.

3. The device of claim 1, wherein an area of the processor is less than five times an area of the substrate.

4. The device of claim 1, wherein
- the memory bandwidth is determined based on a TSV area present between the processor and the memory stack, and
- the network bandwidth is determined based on an input/output (I/O) area of the processor and an area of the substrate.

5. The device of claim 1, wherein the processor is configured to:
- determine the memory bandwidth by controlling a number of TSV connections to the memory stack and a memory signal frequency of the memory stack; and
- determine the network bandwidth by controlling a number of input/output (I/O) connections to the substrate and an I/O signal frequency of the substrate.

6. The device of claim 1, wherein the processor is disposed on the memory stack to be directly connected to the memory stack without a buffer.

7. The device of claim 6, wherein
- the processor is disposed in a direction in which a circuit board of the processor faces the substate,
- the processor and the substrate are connected through a bump.

8. The device of claim 6, wherein
- the processor is disposed in a direction in which a circuit board of the processor faces the memory stack,
- the processor and the memory stack are connected as the TSV connected to the memory stack and an upper end pad of the processor are connected through a micro-bump, and
- the processor and the substrate are connected through a bump.

9. The device of claim 1, further comprising:
- a buffer configured to connect the processor and the memory stack; and
- an interposer disposed between the processor and the substrate,
- wherein the memory stack is disposed on the buffer, and is connected to the processor through the buffer and the interposer.

10. The device of claim 1, wherein
- a number of channels used in the device is determined based on a total number of available lanes and a number of allocated lanes per channel of the device,
- the total number of available lanes is determined by either one or both an area of the processor and an area of the substrate, and
- the number of allocated lanes per channel is determined according to a network protocol of the device.

11. The device of claim 1, further comprising the memory stack and the substrate.

12. A device comprising:
- a memory stack in which memories connected to a processor are stacked,
- wherein the memory stack is connected to the processor through a through-silicon via TSV), and
- wherein a memory bandwidth established through the TSV between the memory stack and the processor is five or less times a network bandwidth between the processor and a substrate disposed under the processor.

13. The device of claim 12, wherein
- a computational performance of the processor is determined based on an area of the processor, and
- the network bandwidth per the computational performance of the processor is greater than or equal to 0.1 bytes per flop.

14. The device of claim 12, wherein an area of the substrate is five or greater times an area of the processor.

15. The device of claim 12, wherein
- the memory bandwidth is determined based on a TSV area present between the processor and the memory stack, and
- the network bandwidth is determined based on an input/output (I/O) area of the processor and an area of the substrate.

16. The device of claim 12, wherein
- the memory bandwidth is determined by controlling a number of TSV connections to the memory stack and a memory signal frequency of the memory stack, and
- the network bandwidth is determined by controlling a number of input/output (I/O) connections to the substrate and an I/O signal frequency of the substrate.

17. The device of claim 12, wherein the memory stack is disposed on the processor to be directly connected to the processor without a buffer.

18. The device of claim 17, wherein
- the memory stack is disposed in a direction in which the memory stack faces a circuit board of the processor,
- the memory stack and the processor are connected as the TSV connected to the memory stack and the memory stack and an upper end pad of the processor are connected through a micro-bump.

19. The device of claim 12, further comprising:

a buffer configured to connect the memory stack and the processor; and an interposer disposed between the processor and the substrate, wherein the memory stack is disposed on the buffer, and is connected to the processor through the buffer and the interposer.

20. The device of claim 12, wherein a number of channels used in the device is determined based on a total number of available lanes and a number of allocated lanes per channel of the device, the total number of available lanes is determined by either one or both an area of the processor and an area of the substrate, and the number of allocated lanes per channel is determined according to a network protocol of the device.

* * * * *